United States Patent
Min et al.

(10) Patent No.: US 12,283,933 B2
(45) Date of Patent: Apr. 22, 2025

(54) ELECTRONIC DEVICE CONTROLLED BASED ON SOUND DATA AND METHOD FOR CONTROLLING ELECTRONIC DEVICE BASED ON SOUND DATA

(71) Applicant: Samsung Electronics Co., Ltd., Suwon-si (KR)

(72) Inventors: Soonki Min, Suwon-si (KR); Nathan Robert Folkman, San Francisco, CA (US); Sean Ryan Bornheimer, San Francisco, CA (US); Areum Ko, Suwon-si (KR); Younguk Do, Suwon-si (KR); Jooil Sung, Suwon-si (KR); Sihak Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 17/581,389

(22) Filed: Jan. 21, 2022

(65) Prior Publication Data
US 2022/0239269 A1    Jul. 28, 2022

Related U.S. Application Data

(63) Continuation of application No. PCT/KR2022/000993, filed on Jan. 19, 2022.
(Continued)

(30) Foreign Application Priority Data

Apr. 14, 2021 (KR) .................. 10-2021-0048760

(51) Int. Cl.
*H03G 3/32* (2006.01)
*G06F 1/16* (2006.01)
(Continued)

(52) U.S. Cl.
CPC .............. *H03G 3/32* (2013.01); *G06F 1/163* (2013.01); *G06F 3/165* (2013.01); *H04W 4/029* (2018.02); *H04W 4/38* (2018.02)

(58) Field of Classification Search
None
See application file for complete search history.

(56) References Cited

U.S. PATENT DOCUMENTS 9,324,322 B1 * 4/2016 Torok
2013/0322634 A1 12/2013 Bennett et al.
(Continued)

FOREIGN PATENT DOCUMENTS

KR   10-2011-0061162 A   6/2011
KR   10-2016-0092384 A   8/2016
(Continued)

OTHER PUBLICATIONS

International Search Report dated May 2, 2022, issued in International Application No. PCT/KR2022/000993.
(Continued)

*Primary Examiner* — James K Mooney
(74) *Attorney, Agent, or Firm* — Jefferson IP Law, LLP

(57) ABSTRACT

An electronic device is provided. The electronic device includes a communication circuit, a display, at least one sensor, and at least one processor. The at least one processor may be configured to obtain sound data regarding a surrounding environment from a wearable electronic device through the communication circuit, obtain sensor data through the at least one sensor, identify whether the surrounding environment matches one of a plurality of preset contexts, based on the sound data and the sensor data, and perform at least one of transmitting, to the wearable electronic device, a signal for controlling the wearable electronic device through the communication circuit or displaying a
(Continued)

notification message on the display, based on the matching context, a state of the display, or whether the wearable electronic device is outputting a sound, in response to identifying that the surrounding environment matches one of the plurality of preset contexts.

11 Claims, 13 Drawing Sheets

Related U.S. Application Data

(60) Provisional application No. 63/140,369, filed on Jan. 22, 2021.

(51) Int. Cl.
*G06F 3/16* (2006.01)
*H04W 4/029* (2018.01)
*H04W 4/38* (2018.01)

(56) References Cited

U.S. PATENT DOCUMENTS

| | | |
|---|---|---|
| 2015/0195641 A1 | 7/2015 | Di Censo et al. |
| 2016/0128006 A1 | 5/2016 | Ji et al. |
| 2016/0234736 A1 | 8/2016 | Kubota et al. |
| 2016/0302027 A1 | 10/2016 | Lee |
| 2017/0011600 A1* | 1/2017 | Joung |
| 2018/0247646 A1 | 8/2018 | Meacham et al. |
| 2019/0098395 A1 | 3/2019 | Keeling |
| 2020/0154513 A1 | 5/2020 | Zhang et al. |
| 2020/0163142 A1 | 5/2020 | Ryoo et al. |
| 2020/0169974 A1 | 5/2020 | Lee et al. |
| 2021/0014610 A1 | 1/2021 | Carrigan et al. |
| 2021/0058135 A1 | 2/2021 | Jung et al. |

FOREIGN PATENT DOCUMENTS

| | | |
|---|---|---|
| KR | 10-2016-0120492 A | 10/2016 |
| KR | 10-1768524 B1 | 8/2017 |
| KR | 10-2018-0072145 A | 6/2018 |
| KR | 10-2019-0060813 A | 6/2019 |
| KR | 10-2019-0106058 A | 9/2019 |
| KR | 10-2020-0037302 A | 4/2020 |
| KR | 10-2020-0059531 A | 5/2020 |
| KR | 10-2021-0008329 A | 1/2021 |
| WO | WO-2021000817 A1 * | 1/2021 |

OTHER PUBLICATIONS

Extended European Search Report dated Mar. 7, 2024; European Appln. No. 22742828.1-1224 / 4206900 PCT/KR2022000993.

* cited by examiner

ELECTRONIC DEVICE CONTROLLED BASED ON SOUND DATA AND METHOD FOR CONTROLLING ELECTRONIC DEVICE BASED ON SOUND DATA

CROSS-REFERENCE TO RELATED APPLICATION(S)

This application is a continuation application, claiming priority under § 365(c), of an International application No. PCT/KR2022/000993, filed on Jan. 19, 2022, which is based on and claims the benefit of a U.S. Provisional application Ser. No. 63/140,369, filed on Jan. 22, 2021, in the U.S. Patent and Trademark Office, and of a Korean patent application number 10-2021-0048760, filed on Apr. 14, 2021, in the Korean Intellectual Property Office, the disclosure of which is incorporated by reference herein in its entirety.

TECHNICAL FIELD

The disclosure relates to an electronic device controlled based on sound data, and a method for controlling an electronic device based on sound data. More particularly, the disclosure relates to an electronic device configured to determine a user's context considering the sound data obtained from a wearable electronic device, along with sensor data, and display a notification message on the display or control the wearable electronic device, considering the matching context, the state of the display, and whether the wearable electronic device is outputting sound.

BACKGROUND ART

Recently, wearable electronic devices, such as wireless Bluetooth earphones, have been widely used. The wearable electronic device may include a sound input device, such as a microphone, and may detect external sound through the sound input device and control the operation based on the detected external sound. For example, based on the detected external sound, the wearable electronic device may activate or deactivate the noise canceling function that prevents the user from hearing external noise, adjust the volume of the output sound, activate or deactivate a function for hearing external sound, or output a notification sound to draw the user's attention.

The above information is presented as background information only to assist with an understanding of the disclosure. No determination has been made, and no assertion is made, as to whether any of the above might be applicable as prior art with regard to the disclosure.

DISCLOSURE

Technical Problem

The wearable electronic device may determine the context based on the detected external sound and output a notification sound to draw the user's attention depending on the determined context. However, if the user carelessly pays no attention to the notification sound, the notification sound may be less effective.

Further, since the wearable electronic device determines the context by relying only on the external sound without other parameters which may represent the user's context when controlling the operation based on the detected external sound, the accuracy of determining the context may be limited.

Aspects of the disclosure are to address at least the above-mentioned problems and/or disadvantages and to provide at least the advantages described below. Accordingly, an aspect of the disclosure is to provide an electronic device configured to determine the user's context considering the sound data obtained from a wearable electronic device, along with sensor data, and display a notification message on the display or control the wearable electronic device, considering the matching context, the state of the display, and whether the wearable electronic device is outputting sound.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a communication circuit, a display, at least one sensor, and at least one processor. The at least one processor may be configured to obtain sound data regarding a surrounding environment from a wearable electronic device through the communication circuit, obtain sensor data through the at least one sensor, identify whether the surrounding environment matches one of a plurality of preset contexts, based on the sound data and the sensor data, and perform at least one of transmitting, to the wearable electronic device, a signal for controlling the wearable electronic device through the communication circuit or displaying a notification message on the display, based on the matching context, a state of the display, or whether the wearable electronic device is outputting a sound, in response to identifying that the surrounding environment matches one of the plurality of preset contexts.

In accordance with another aspect of the disclosure, a method performed in an electronic device is provided. The method includes obtaining sound data regarding a surrounding environment from a wearable electronic device, obtaining sensor data through at least one sensor of the electronic device, identifying whether the surrounding environment matches one of a plurality of preset contexts, based on the sound data and the sensor data, and performing at least one of transmitting a signal for controlling the wearable electronic device to the wearable electronic device or displaying a notification message on a display of the electronic device, based on the matching context, a state of the display, and the wearable electronic device is outputting a sound, in response to identifying that the surrounding environment matches one of the plurality of preset contexts.

In accordance with another aspect of the disclosure, a wearable electronic device is provided. The wearable electronic device includes a communication circuit, a sound input device, a sound output device, at least one sensor, and at least one processor. The at least one processor may be configured to establish a communication connection with an external electronic device through the communication circuit, obtain sound data regarding a surrounding environment through the sound input device, obtain sensor data through the at least one sensor, identify whether the surrounding environment matches one of a plurality of preset contexts, based on the sound data and the sensor data, and perform at least one of controlling the sound output device or transmitting a signal to the external electronic device to display a notification on a display of the external electronic device, based on the matching context, a state of the display, or whether the wearable electronic device is outputting a sound, in response to identifying that the surrounding environment matches one of the plurality of preset contexts.

Advantageous Effects

Various embodiments of the disclosure, there are provided an electronic device controlled based on sound data, and a method for controlling an electronic device based on sound data. According to various embodiments of the disclosure, an electronic device may determine the user's context considering the sound data obtained from a wearable electronic device, along with sensor data, and display a notification message on the display or control the wearable electronic device, considering the context, the state of the display, and whether the wearable electronic device is outputting sound.

According to various embodiments of the disclosure, the electronic device may display the notification message on the display. Thus, although the user carelessly pays no attention to the notification sound output on the wearable electronic device, the user may recognize the notification message displayed on the display. Thus, it is possible to effectively draw the user's attention.

According to various embodiments of the disclosure, the electronic device determines the user's context considering the sound data obtained from the wearable electronic device, along with sound data. Thus, the electronic device may correctly determine the user's context as compared with when relying only on sound data.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
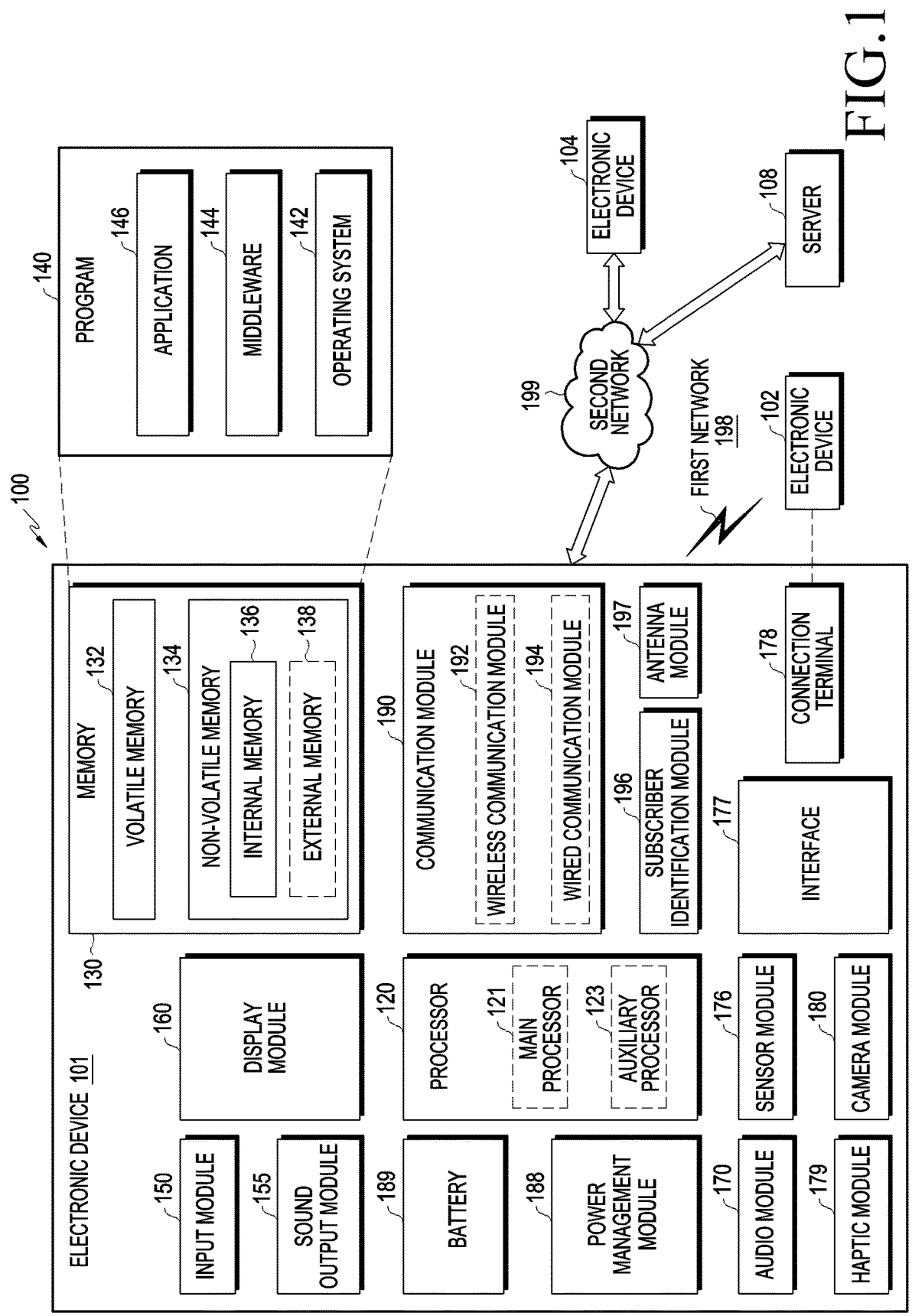
FIG. 1 is a view illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an external electronic device 102 via a first network 198 (e.g., a short-range wireless communication network), or an external electronic device 104 or a server 108 via a second network 199 (e.g., a long-range wireless communication network). According to an embodiment, the electronic device 101 may communicate with the external electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a fifth generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
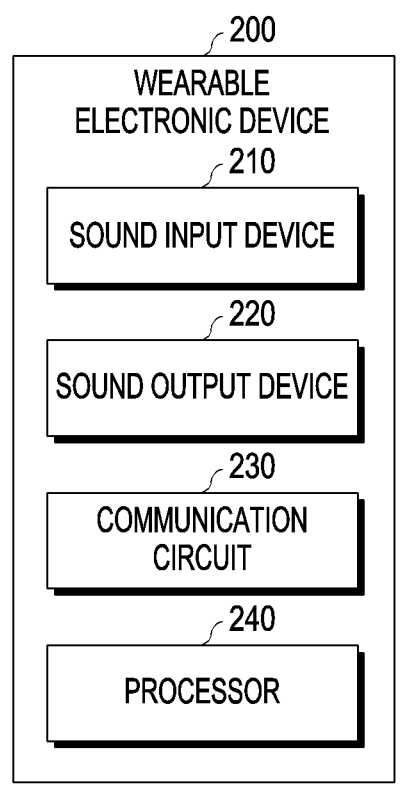
FIG. 2 is a block diagram illustrating a wearable electronic device according to an embodiment of the disclosure.

FIG. 2 is a block diagram illustrating a wearable electronic device according to an embodiment of the disclosure.

Referring to FIG. 2, a wearable electronic device 200 may include a sound input device 210, a sound output device 220, a communication circuit 230, and a processor 240. According to various embodiments of the disclosure, the sound input device 210 may detect the sound generated around the wearable electronic device 200 and generate data corresponding to the sound. According to various embodiments of the disclosure, the sound input device 210 may transfer the generated data to the processor 240. For example, the sound input device 210 may include at least one microphone.

According to various embodiments of the disclosure, the sound output device 220 may output a sound based on the electrical signal transferred from the processor 240. According to various embodiments of the disclosure, the sound input device 210 may include a speaker.

According to various embodiments of the disclosure, the communication circuit 230 may support wireless communication between the wearable electronic device 200 and other electronic devices other than the wearable electronic device 200. According to various embodiments of the disclosure, the type of wireless communication supported by the communication circuit 230 is not limited. For example, the communication circuit 230 may support Bluetooth and Bluetooth low energy (BLE) communication.

According to various embodiments of the disclosure, the processor 240 may obtain data from other components of the wearable electronic device 200, perform various data processing or computations based on the obtained data, and transfer signals for controlling the operation of the other components to the other components. According to various embodiments of the disclosure, the wearable electronic device 200 may include a plurality of processors 240.

Figure 3:
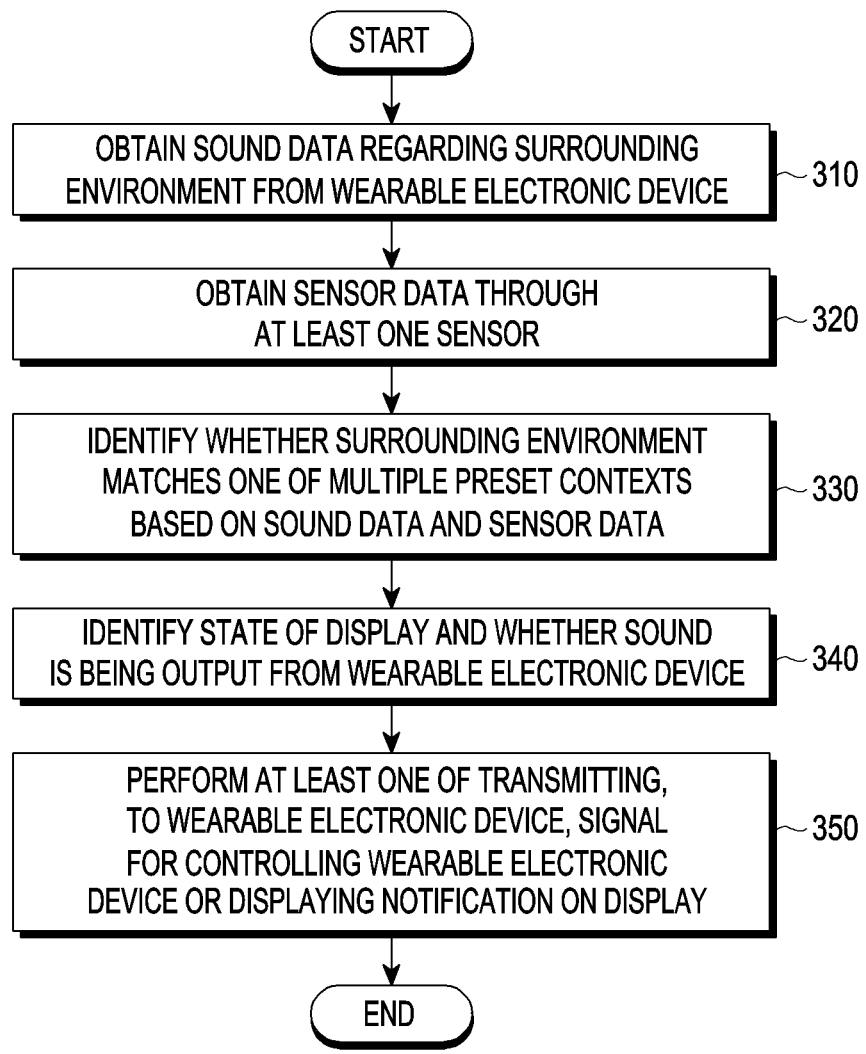
FIG. 3 illustrates operations performed in an electronic device according to an embodiment of the disclosure.

FIG. 3 illustrates operations performed in an electronic device according to an embodiment of the disclosure.

Referring to FIG. 3, in operation 310, at least one processor (e.g., processor 120) of an electronic device (e.g., the electronic device 101) may obtain sound data regarding the surrounding environment from a wearable electronic device (e.g., the wearable electronic device 200) through a communication circuit (e.g., the communication module 190). According to various embodiments of the disclosure, the sound data may be obtained through the sound input device 210 of the wearable electronic device 200 and may be transferred to the electronic device 101 through the communication circuit 230.

In operation 320, at least one processor 120 of the electronic device 101 may obtain sensor data through at least one sensor (e.g., the sensor module 176). According to various embodiments of the disclosure, at least one sensor 176 may include a global positioning system (GPS) sensor. The sensor data may represent position information about the electronic device 101. According to various embodiments of the disclosure, at least one sensor 176 may include a vibration sensor. According to various embodiments of the disclosure, at least one sensor 176 may include a microphone. According to various embodiments of the disclosure, the at least one sensor 176 may include a sensor that detects the motion state of the electronic device 101, such as an acceleration sensor and/or a gyro sensor.

In operation 330, the at least one processor 120 of the electronic device 101 may identify whether the surrounding environment matches one of a plurality of preset contexts based on the sound data and the sensor data. According to various embodiments of the disclosure, the plurality of preset contexts may include at least one of a context in which the user of the electronic device 101 utters, a context in which another person is calling the user of the electronic device 101 indoors, a context in which the user of the electronic device 101 is active, an indoor event context, a context in which there is a safety issue indoors, or a context in which the user of the electronic device 101 is using a transportation means.

According to various embodiments of the disclosure, the at least one processor 120 may identify that the surrounding environment matches the context in which the user utters, based on the sound data and the vibration sensor data obtained through the vibration sensor. According to various embodiments of the disclosure, the at least one processor 120 may identify that the surrounding environment matches the context in which the user utters when it is identified that vibration occurs when the utterance indicated by the sound data occurs.

According to various embodiments of the disclosure, the at least one processor 120 may identify that the surrounding environment does not match the context in which the user utters, if it is identified that the user is singing according to the music output from the wearable electronic device, based on the sound data. According to various embodiments of the disclosure, the at least one processor 120 may perform a speaking-to-text (STT) function based on the sound data and may identify that the user is singing according to the music output from the wearable electronic device 200 when the accuracy of STT is less than a specific level.

According to various embodiments of the disclosure, the at least one processor 120 may identify that the surrounding environment matches the context in which another person is calling the user of the electronic device 101 indoors, based on the sound data and the GPS sensor data obtained through a GPS sensor. According to various embodiments of the disclosure, when it is identified that the GPS sensor data indicates that the electronic device 101 is located indoors, and the sound data indicates one of predetermined keywords corresponding to the user of the electronic device 101, the at least one processor 120 may identify that the surrounding environment matches the context in which another person is calling the user of the electronic device 101 indoors. According to various embodiments of the disclosure, the predetermined keywords may be set as inputs to the electronic device 101. For example, the predetermined keywords may include at least one of the name, nickname, or title of the user of the electronic device 101.

According to various embodiments of the disclosure, the at least one processor 120 may identify that the surrounding environment matches the context in which the user of the electronic device 101 is active, based on the sound data and vibration sensor data obtained through the vibration sensor. According to various embodiments of the disclosure, the at least one processor 120 may store a program capable of distinguishing various activities based on the vibration sensor data and apply the program to the vibration sensor data to thereby identify whether the vibration sensor data corresponds to a specific activity. According to various embodiments of the disclosure, when the vibration sensor data corresponds to some activities, such as walking and running, among various activities distinguishable by the program, the at least one processor 120 may identify that the surrounding environment matches the context in which the user of the electronic device 101 is active, by further referring to the GPS sensor data. For example, when the vibration sensor data corresponds to running, the at least one processor 120 may identify whether the moving speed of the electronic device 101 falls within a general running speed range based on the GPS sensor data and, if the moving speed of the electronic device 101 falls within the general running speed range, identify that the surrounding environment matches the context in which the user of the electronic device 101 is active.

According to various embodiments of the disclosure, when the vibration sensor data corresponds to a specific activity, and the repetition cycle of the vibration sensor data is similar to the repetition cycle of the sound data, the at least one processor 120 may identify that the surrounding environment matches the context in which the user is active. For example, when the user runs, the vibration sensor data may be repeated at a predetermined cycle when the user periodically takes a step, and the sound data may also be repeated at a predetermined cycle when the user periodically puts her foot on the ground. Besides running, when the user performs an exercise in which constant motion is repeated, such as jumping rope, walking, or swimming, vibration sensor data and sound data may be constantly repeated. As the repetition cycle of the vibration sensor data and the repetition cycle of the sound data are similar to each other, the at least one processor 120 may identify that the user of the electronic device 101 is doing a specific activity.

According to various embodiments of the disclosure, when the vibration sensor data corresponds to a specific activity, the moving speed of the electronic device 101 identified by the GPS sensor data falls within a general speed range for the specific activity, and the repetition cycle of the vibration sensor data is similar to the repetition cycle of the sound data, the at least one processor 120 may identify that the surrounding environment matches the context in which the user is active.

According to various embodiments of the disclosure, the at least one processor 120 may identify that the surrounding environment matches the indoor event context based on the GPS sensor data and the sound data. According to various embodiments of the disclosure, when the GPS sensor data indicates a predesignated position, and the sound data indicates one of preset sounds, the at least one processor 120 may identify that the surrounding environment matches the indoor event context. According to various embodiments of the disclosure, the predesignated position may include at least one of a position specified by the input of the user of the electronic device 101 or the position frequently visited by the user of the electronic device 101. According to various embodiments of the disclosure, the preset sounds may include at least one of a doorbell sound, a door knocking sound, human yelling, a door barking sound, a cat meowing sound, a glass breaking sound, a gunshot sound, or a baby crying sound. According to various embodiments of the disclosure, the indoor event context may be defined corresponding to each of the preset sounds. For example, the indoor event context may include at least one of a context in which a doorbell rings, a context in which someone knocks on the door, a context in which person yells, a context in which a door barks, a context in which a cat meows, a context in which glass is broken, a context in which a gun fires, or a context in which a baby cries.

According to various embodiments of the disclosure, the at least one processor 120 may identify that the surrounding environment matches the context in which there is a safety issue indoors based on the GPS sensor data and the sound data. According to various embodiments of the disclosure, when the GPS sensor data indicates that the electronic device 101 is located indoors, and the sound data indicates one of preset sounds, the at least one processor 120 may identify that the surrounding environment matches the context in which there is a safety issue indoors. According to various embodiments of the disclosure, the preset sounds may be sounds related to safety issues that may occur indoors. For example, the preset sounds may include at least one of a fire alarm sound or a fire engine sound. According to various embodiments of the disclosure, the context in which there is a safety issue indoors may be defined corresponding to each of the preset sounds. For example, the context in which there is a safety issue indoors may include at least one of a context in which a fire alarm sounds or a context in which a sound of a fire engine is heard.

According to various embodiments of the disclosure, the at least one processor 120 may identify that the surrounding environment matches the context in which the user is using a transportation means, based on the GPS sensor data, vibration sensor data, and sound data. According to various embodiments of the disclosure, when the vibration sensor data indicates a vibration pattern corresponding to the transportation means, the moving speed of the electronic device 101 indicated by the GPS sensor data falls within the general moving speed range of the transportation means, and the sound data indicates a characteristic sound generated from the transportation means, the at least one processor 120 may identify that the surrounding environment matches the context in which the user is using the transportation means. For example, the transportation means may include a bus and a subway.

In operation 340, the at least one processor 120 of the electronic device 101 may identify the state of the display (e.g., the display module 160) and whether the wearable electronic device 200 is outputting sound. According to various embodiments of the disclosure, the state of the display 160 may include an off state of the display 160 and an on state of the display 160.

According to various embodiments of the disclosure, the at least one processor 120 may receive information regarding the sound being output from the wearable electronic device through the communication circuit 190, identifying whether the wearable electronic device 200 is outputting sound. Identifying whether the wearable electronic device 200 is outputting sound in operation 340 may mean that the wearable electronic device 200 is outputting sound to be recognized by the user, like the sound corresponding to music or video, from the wearable electronic device 200. For example, when the wearable electronic device 200 is outputting sound to cancel off the ambient noise to perform the noise canceling function, the at least one processor 120 may identify that the wearable electronic device is outputting no sound.

In operation 350, the at least one processor 120 may perform at least one of transmitting a signal for controlling the wearable electronic device 200 through the communication circuit 190 to the wearable electronic device 200 or displaying a notification on the display 160 based on the matching context identified in operation 330 and the state of the display 160 and whether the wearable electronic device 200 is outputting sound, identified in operation 340.

According to various embodiments of the disclosure, the at least one processor 120 may identify a first state if it is identified that the display 160 is on regardless of whether the wearable electronic device 200 is outputting sound, a second state if the display 160 is off, and the wearable electronic device is outputting sound, and a third state if the display 160 is off and the wearable electronic device 200 is outputting no sound.

According to various embodiments of the disclosure, when it is identified that the surrounding environment matches the context in which the user utters in operation 330, the at least one processor 120 may transmit, to the wearable electronic device 200, a control signal to allow the wearable electronic device 200 to perform the operations shown in Table 1, according to the first state, second state, and third state in operation 350.

TABLE 1

|  | first state | second state | third state |
|---|---|---|---|
| noise canceling function | deactivated | deactivated | deactivated |
| ambient sound hearing function | activated | activated | activated |
| sound output | pause | pause | — |

According to various embodiments of the disclosure, after performing operation 350, if the user performs an input to resume the sound output that has been paused by the user, the at least one processor 120 may control the wearable electronic device 200 to return to the state before transmission of the control signal.

According to various embodiments of the disclosure, if it is identified that the surrounding environment matches the context in which another person is calling the user of the electronic device 101 in operation 330, the at least one processor 120 may perform the operations shown in Table 2, according to the first state, second state, and third state, in operation 350.

TABLE 2

|  | first state | second state | third state |
|---|---|---|---|
| Control signal | — | output notification sound | output TTS voice "Someone is calling you" |
| display message |  |  |  |
| message type | toast message | heads-up message | arbitrary type |

Referring to Table 2, in the first state, the at least one processor 120 may display a toast message indicating that someone is calling the user, on the display 160. In the second state, the at least one processor 120 may display a heads-up message, indicating that someone is calling the user, on the display 160 and may transmit a control signal to allow the wearable electronic device 200 to output a notification sound to the wearable electronic device 200. In the third state, the at least one processor 120 may display a message, indicating that someone is calling the user, in an arbitrary type, on the display 160 and may transmit, to the wearable electronic device 200, a control signal to allow the wearable electronic device 200 to output a TTS voice indicating that someone is calling the user.

According to various embodiments of the disclosure, when it is identified that the surrounding environment matches the context in which the user is active in operation 330, the at least one processor 120 may transmit, to the wearable electronic device 200, a control signal to allow the wearable electronic device 200 to deactivate the noise canceling function and activate the ambient sound hearing function, regardless of the first state, second state, and third state in operation 350. According to various embodiments of the disclosure, as the user is active in the first state, the at least one processor 120 may display, on the display 160, a message indicating that the noise canceling function is deactivated and the ambient sound hearing function is activated. According to various embodiments of the disclosure, after performing operation 350, if the user is identified to terminate the activity, the at least one processor 120 may control the wearable electronic device 200 to return to the state before transmission of the control signal.

According to various embodiments of the disclosure, if it is identified that the surrounding environment matches the indoor event context in operation 330, the at least one processor 120 may perform the operations shown in Table 3, according to the first state, second state, and third state, in operation 350.

TABLE 3

|  | first state | second state | third state |
|---|---|---|---|
| Control signal | — | output notification sound | output TTS voice |
| display message |  | message corresponding to indoor event context |  |
| message type | toast message | heads-up message | arbitrary type |

Referring to Table 3, in the first state, the at least one processor 120 may display, on the display 160, a message, corresponding to the indoor event context, e.g., a context in which the doorbell rings, in the form of a toast message. In the second state, the at least one processor 120 may display, on the display 160, a message corresponding to the indoor event context, in the form of a heads-up message, and may transmit a control signal to allow the wearable electronic device 200 to output a notification sound to the wearable electronic device 200. In the third state, the at least one processor 120 may display, on the display 160, a message indicating the indoor event context, in an arbitrary type, and may transmit, to the wearable electronic device 200, a control signal to allow the wearable electronic device 200 to output a TTS sound corresponding to the indoor event context. According to various embodiments of the disclosure, if it is identified that the surrounding environment matches the context in which there is a safety issue indoors in operation 330, the at least one processor 120 may perform the operations shown in Table 4, according to the first state, second state, and third state, in operation 350.

TABLE 4

|  | first state | second state | third state |
|---|---|---|---|
| Control signal |  | deactivate noise canceling function activate ambient sound hearing function |  |
| display message | message corresponding to safety issue | — | — |

Referring to Table 4, the at least one processor 120 may transmit, to the wearable electronic device 200, a control signal to allow the wearable electronic device 200 to deactivate the noise canceling function and activate the ambient sound hearing function, regardless of the first state, second state, and third state. According to various embodiments of the disclosure, at least one processor 120 may display a message corresponding to a safety issue, e.g., a context in which a fire alarm sounds, on the display 160 in the first state.

According to various embodiments of the disclosure, if it is identified that the surrounding environment matches the context in which the user is using a transportation means in operation 330, the at least one processor 120 may perform the operations shown in Table 5, according to the first state, second state, and third state, in operation 350.

TABLE 5

|  | first state | second state | third state |
|---|---|---|---|
| Control signal message | display message | deactivate noise canceling function activate ambient sound hearing function display message + notification sound | TTS message |

Referring to Table 5, the at least one processor 120 may transmit, to the wearable electronic device 200, a control signal to allow the wearable electronic device 200 to deactivate the noise canceling function and activate the ambient sound hearing function, regardless of the first state, second state, and third state.

As described in Table 5, according to various embodiments of the disclosure, the at least one processor 120 may display a message asking the user's destination on the display 160 in the first state. According to various embodiments of the disclosure, in the second state, the at least one processor 120 may control the display 160 in an on state, display a message asking the user's destination on the display 160, and transmit, to the wearable electronic device 200, a control signal to allow the wearable electronic device 200 to output a notification sound urging the user to view the display 160. According to various embodiments of the disclosure, in the third state, the at least one processor 120 may transmit, to the wearable electronic device 200, a control signal to allow the wearable electronic device 200 to output a TTS voice corresponding to the message asking the user's destination.

According to various embodiments of the disclosure, the at least one processor 120 may receive the user's destination in the form of a voice or text and, when the location of the electronic device 101 indicated by the GPS sensor data is close to the user's destination, control the wearable electronic device 200 to display, on the display 160, a message indicating that it is almost at the destination or output a TTS voice corresponding to the message.

Figure 4:
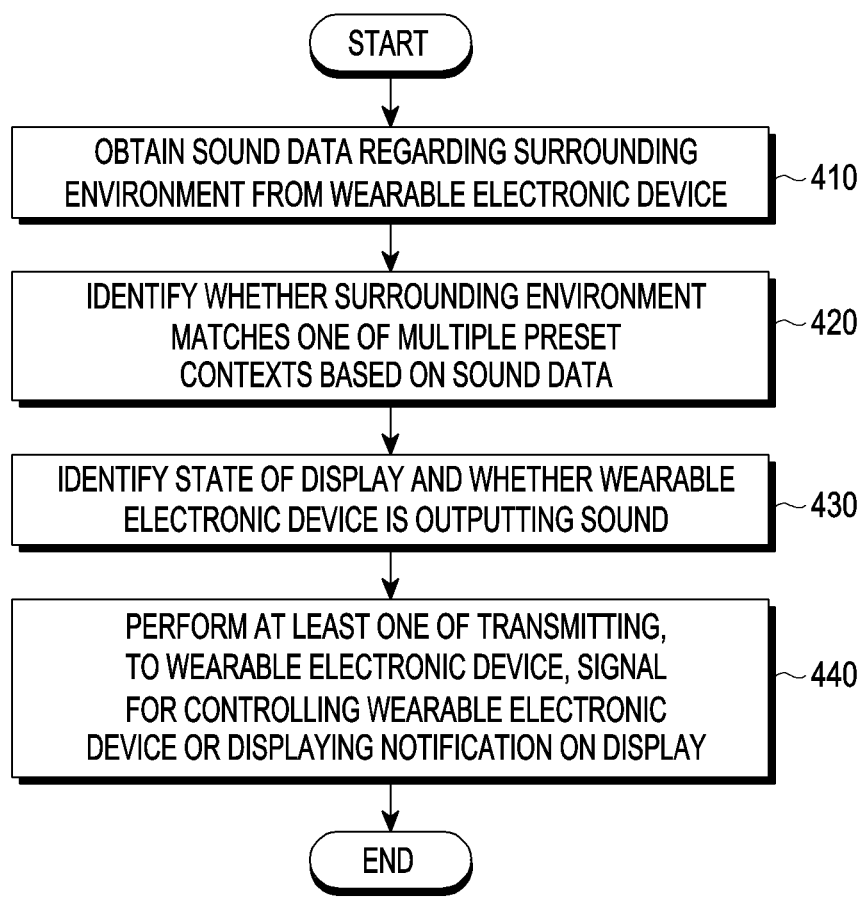
FIG. 4 illustrates operations performed in an electronic device according to an embodiment of the disclosure.

FIG. 4 illustrates operations performed in an electronic device according to an embodiment of the disclosure.

Referring to FIG. 4, in operation 410, at least one processor (e.g., processor 120) of an electronic device (e.g., the electronic device 101) may obtain sound data regarding the surrounding environment from a wearable electronic device (e.g., the wearable electronic device 200) through a communication circuit (e.g., the communication module 190). Details regarding operation 310 of FIG. 3 may be applied to operation 410.

In operation 420, the at least one processor 120 of the electronic device 101 may identify whether the surrounding environment matches one of a plurality of preset contexts based on the sound data. According to various embodiments of the disclosure, the plurality of preset contexts may include at least one of a context in which another person is calling the user of the electronic device 101, a context in which loud noise is generated, or a context in which there is a safety issue.

According to various embodiments of the disclosure, when it is identified that the sound data indicates one of predetermined keywords corresponding to the user of the electronic device 101, the at least one processor 120 may identify that the surrounding environment matches the context in which another person is calling the user of the electronic device 101.

According to various embodiments of the disclosure, when the sound data indicates a sound of a threshold level or more, the at least one processor 120 may identify that the surrounding environment matches the context in which loud noise is generated. According to various embodiments of the disclosure, in response to identifying that the sound data indicates a sound of a threshold level or more and indicates a preset pattern, the at least one processor 120 may identify that the surrounding environment matches the context in which loud noise is generated. According to various embodiments of the disclosure, the preset pattern may be a pattern pre-learned corresponding to the context in which loud noise may be generated, like noise around a construction site or airport.

According to various embodiments of the disclosure, when the sound data indicates one of preset sounds, the at least one processor 120 may identify that the surrounding environment matches the context in which there is a safety issue. According to various embodiments of the disclosure, the preset sounds may be sounds related to safety issues. For example, the preset sounds may include at least one of a fire alarm sound, a fire engine sound, a police car sound, an ambulance sound, or a sound when a large variation, such as a truck, backs up.

In operation 430, the at least one processor 120 of the electronic device 101 may identify the state of the display (e.g., the display module 160) and whether the wearable electronic device 200 is outputting sound. Details regarding operation 340 of FIG. 3 may be equally applied to operation 430.

In operation 440, the at least one processor 120 may perform at least one of transmitting a signal for controlling the wearable electronic device 200 through the communication circuit 190 to the wearable electronic device 200 or displaying a notification on the display 160 based on the matching context identified in operation 420 and the state of the display 160 and whether the wearable electronic device 200 is outputting sound, identified in operation 430.

According to various embodiments of the disclosure, the at least one processor 120 may identify a first state if it is identified that the display 160 is on regardless of whether the wearable electronic device 200 is outputting sound, a second state if the display 160 is off, and the wearable electronic device is outputting sound, and a third state if the display 160 is off and the wearable electronic device 200 is outputting no sound.

According to various embodiments of the disclosure, when it is identified that the surrounding environment matches the context in which another person is calling the user of the electronic device 101 in operation 420, the at least one processor 120 may perform the operations shown in Table 2 according to the first state, second state, and third state in operation 440. Regarding the operations shown in Table 2, details described above in connection with FIG. 3 may be likewise applied to operation 440.

According to various embodiments of the disclosure, when it is identified that the surrounding environment matches the context in which loud noise is generated in operation 420, the at least one processor 120 may transmit, to the wearable electronic device 200, a control signal to allow the wearable electronic device 200 to perform the operations shown in Table 6, according to the first state, second state, and third state in operation 440. After performing operation 440, when the state in which the sound data represents a sound less than the threshold level lasts for a predetermined time or longer, the at least one processor 120 may control the wearable electronic device 200 to return to the state before transmission of the control signal.

TABLE 6

|  | first state | second state | third state |
| --- | --- | --- | --- |
| noise canceling function | activated | activated | activated |
| ambient sound hearing function | deactivated | deactivated | deactivated |
| sound output | volume up | volume down | — |

According to various embodiments of the disclosure, if it is identified that the surrounding environment matches the context in which there is a safety issue in operation 420, the at least one processor 120 may perform the operations shown in Table 4, according to the first state, second state, and third state, in operation 440. Regarding the operations shown in Table 4, details described above in connection with FIG. 3 may be likewise applied to operation 440.

Figure 5:
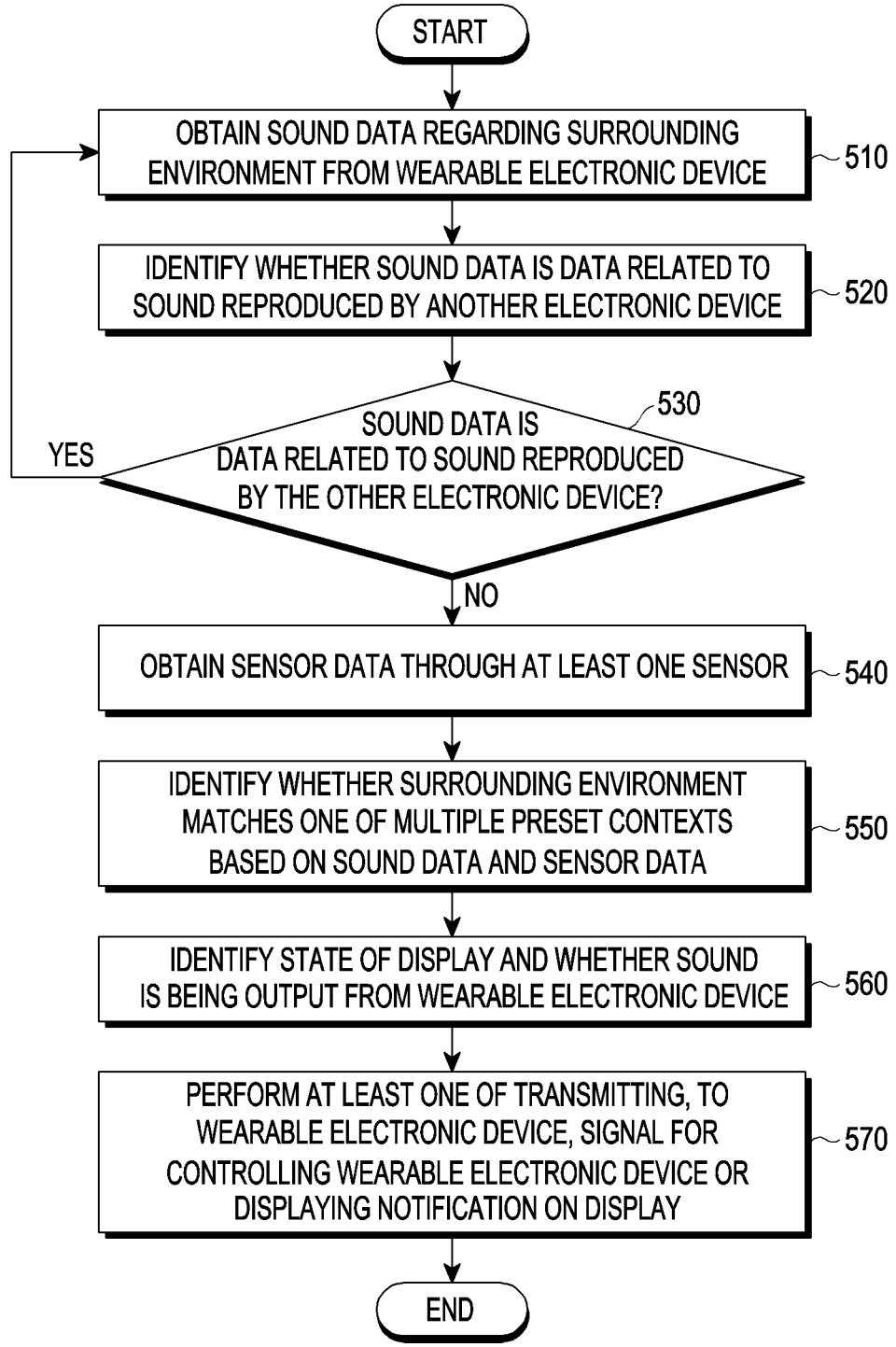
FIG. 5 illustrates operations performed in an electronic device according to an embodiment of the disclosure.

FIG. 5 illustrates operations performed in an electronic device according to an embodiment of the disclosure.

Referring to FIG. 5, in operation 510, at least one processor (e.g., processor 120) of an electronic device (e.g., the electronic device 101) may obtain sound data regarding the surrounding environment from a wearable electronic device (e.g., the wearable electronic device 200) through a communication circuit (e.g., the communication module 190). Details regarding operation 310 of FIG. 3 may be applied to operation 510.

In operation 520, the at least one processor 120 of the electronic device 101 may identify whether the sound data is data related to the sound reproduced by an electronic device other than the electronic device 101. According to various embodiments of the disclosure, the at least one processor 120 may convert the sound data into a log-mel signal and may extract a sound feature vector and an ambient noise feature vector based on the converted log-mel signal. The at least one processor 120 may identify whether the sound data is data related to the sound reproduced by the other electronic device or data related to a noise source actually existing, based on the log-mel signal, sound feature vector, and ambient noise feature vector. According to various embodiments of the disclosure, the at least one processor 120 may analyze the frequency band of the sound data and may identify that the sound data is data related to the sound reproduced by the other electronic device based on the absence of a component of a specific frequency band.

When it is determined in operation 530 that the sound data is data related to the sound reproduced by an electronic device other than the electronic device 101, the at least one processor 120 may repeat operation 510 through operation 530 until sound data related to an actually existing noise source is identified. In other words, in determining the surrounding environment, the at least one processor 120 may not utilize the sound data related to the sound reproduced by the other electronic device.

When it is determined in operation 530 that the sound data is not data related to the sound reproduced by an electronic device other than the electronic device 101, the at least one processor 120 may perform operation 540. In operation 540, the at least one processor 120 may obtain sensor data through at least one sensor (e.g., the sensor module 176). Details regarding operation 320 of FIG. 3 may be equally applied to operation 540.

In operation 550, the at least one processor 120 may identify whether the surrounding environment matches one of a plurality of preset contexts based on the sound data and the sensor data. Details regarding operation 330 of FIG. 3 may be equally applied to operation 550.

In operation 560, the at least one processor 120 may identify the state of the display (e.g., the display module 160) and whether the wearable electronic device 200 is outputting sound. Details regarding operation 340 of FIG. 3 may be equally applied to operation 560.

In operation 570, the at least one processor 120 may perform at least one of transmitting a signal for controlling the wearable electronic device 200 through the communication circuit 190 to the wearable electronic device 200 or displaying a notification on the display 160 based on the matching context identified in operation 550 and the state of the display 160 and whether the wearable electronic device 200 is outputting sound, identified in operation 560. Details regarding operation 350 of FIG. 3 may be equally applied to operation 570.

Although FIG. 5 illustrates that the at least one processor 120 identifies whether the sound data is sound data related to the sound reproduced by another electronic device, according to various embodiments of the disclosure, it may be identified by the processor 240 of the wearable electronic device 200 whether the sound data is sound data related to the sound reproduced by the other electronic device. In this case, the wearable electronic device 200 may transmit information indicating whether the sound data is sound data related to the sound reproduced by the other electronic device to the electronic device 101. According to various embodiments of the disclosure, the wearable electronic device 200 does not transmit the sound data related to the sound reproduced by the other electronic device to the electronic device 101 and transmits only sound data related to the actually existing noise source to the electronic device 101.

According to various embodiments of the disclosure, when determining the surrounding environment, the electronic device 101 may consider only sound data related to the actually existing noise source while disregarding the sound data related to the sound reproduced by the other electronic device. Since the noise generated by content being reproduced by the other electronic device does not represent the surrounding environment of the electronic device 101, the electronic device 101 may disregard the sound data related to the sound reproduced by the other electronic device, thereby accurately determining the surrounding environment.

Figure 6A:
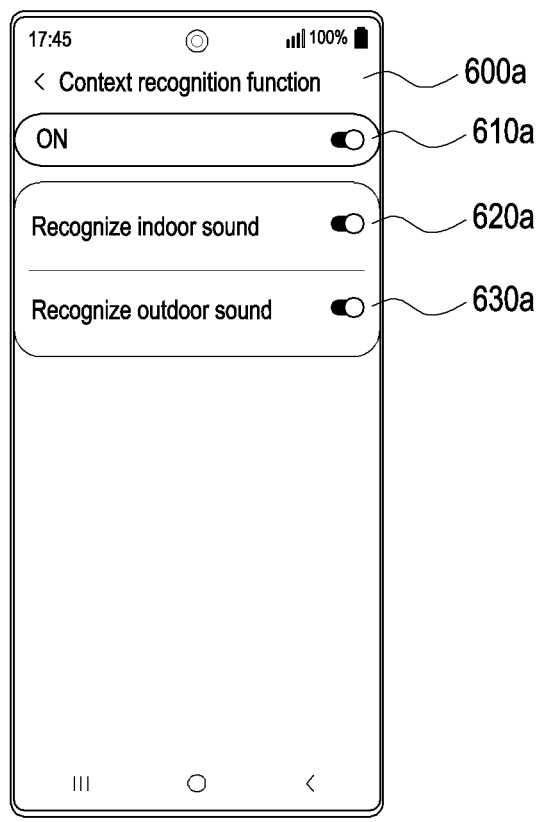
FIGS. 6A, 6B, and 6C illustrate screens displayed on an electronic device according to various embodiments of the disclosure.
Figure 6B:
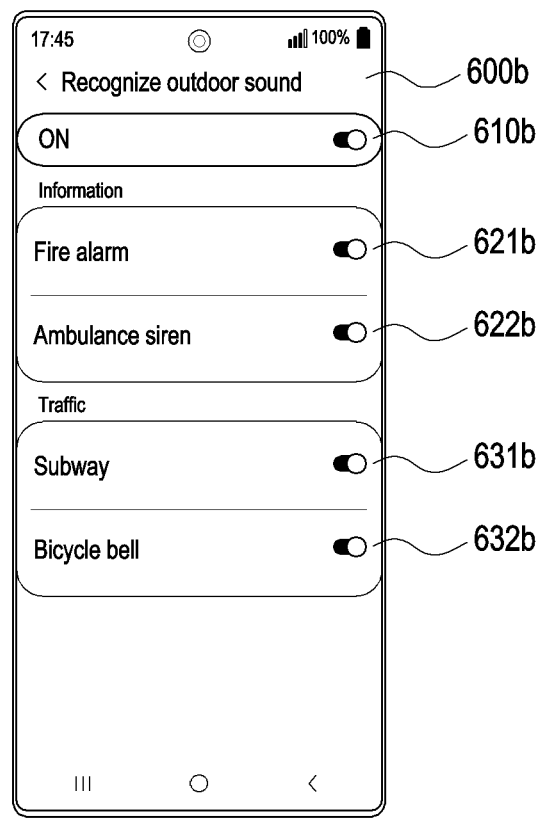
Figure 6C:
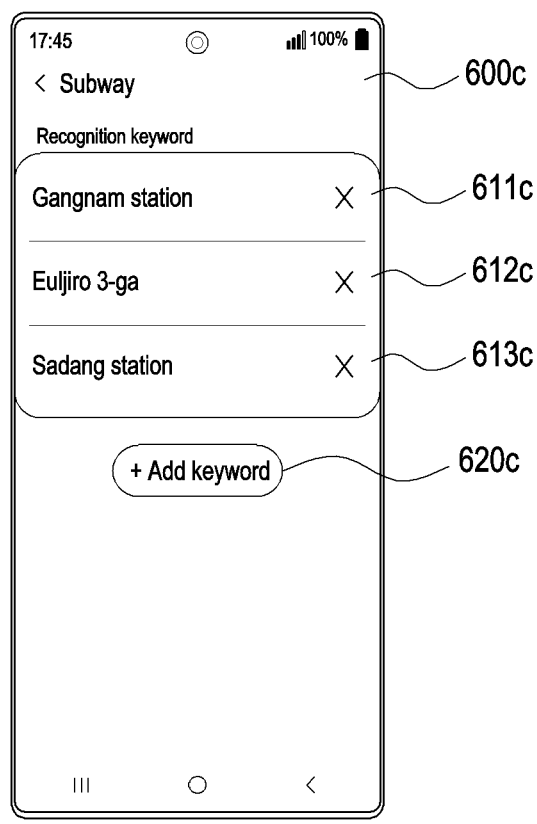

FIGS. 6A, 6B, and 6C illustrate screens displayed on an electronic device according to various embodiments of the disclosure.

FIG. 6A illustrates a settings interface 600a which is displayed on the display 160 of the electronic device 101 and through which it is possible to set whether to recognize by the electronic device 101 for each scenario of the surrounding environment according to an embodiment of the disclosure.

Referring to FIG. 6A, the settings interface may include an interface 610*a* for controlling the turn-on/off of the context recognition function, an interface 620*a* for controlling whether to activate or deactivate indoor sound recognition when the context recognition function is on, and an interface 630*a* for controlling whether to activate or deactivate outdoor sound recognition.

FIG. 6B illustrates an outdoor sound recognition settings interface 600*b* for setting whether to recognize by the electronic device 101 for each specific scenario that may occur outdoors, in relation to outdoor sound recognition according to an embodiment of the disclosure.

Referring to FIG. 6B, the outdoor sound recognition settings interface 600*b* may include an interface 610*b* for controlling whether to activate or deactivate outdoor sound recognition. According to various embodiments of the disclosure, the outdoor sound recognition settings interface 600*b* may include an interface 621*b* for controlling whether to activate or deactivate fire alarm recognition function and an interface 622*b* for controlling whether to activate or deactivate ambulance siren recognition function. According to various embodiments of the disclosure, the outdoor sound recognition settings interface 600*b* may include an interface 631*b* for controlling whether to activate or deactivate the function of recognizing the context in which the user is aboard the subway train and an interface 632*b* for controlling whether to activate or deactivate the function of recognizing the context in which a bicycle bell rings.

FIG. 6C illustrates an interface 600*c* for setting the recognition keywords for recognizing the context in which the user is aboard the subway train in relation to the function of recognizing the context in which the user is aboard the subway train according to an embodiment of the disclosure.

Referring to FIG. 6C, the interface 600*c* may display preset recognition keywords 611*c*, 612*c*, and 613*c* and may include an interface 620*c* for adding new keywords. According to various embodiments of the disclosure, the at least one processor 120 of the electronic device 101 may use detecting the preset recognition keywords 611*c*, 612*c*, and 613*c* as at least some of conditions for identifying that the user is aboard the subway train, based on the sound data.

Figure 7:
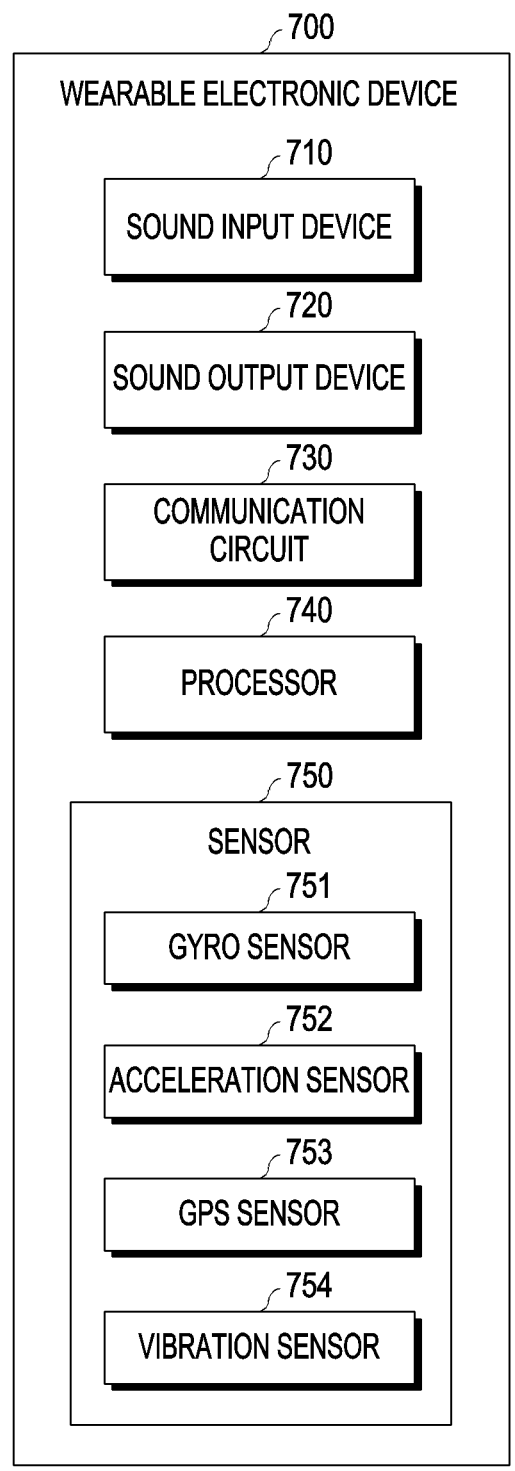
FIG. 7 is a block diagram illustrating a wearable electronic device according to an embodiment of the disclosure.

FIG. 7 is a block diagram illustrating a wearable electronic device according to an embodiment of the disclosure.

Referring to FIG. 7, a wearable electronic device 700 may include a sound input device 710, a sound output device 720, a communication circuit 740, a processor 740, and a sensor 750. The details of the sound input device 210, sound output device 220, communication circuit 230, and processor 240 described above in connection with FIG. 2 may be applied to the sound input device 710, sound output device 720, communication circuit 730, and processor 740. According to various embodiments of the disclosure, the sensor 750 may include a gyro sensor 751, an acceleration sensor 752, a GPS sensor 753, and a vibration sensor 754.

Figure 8:
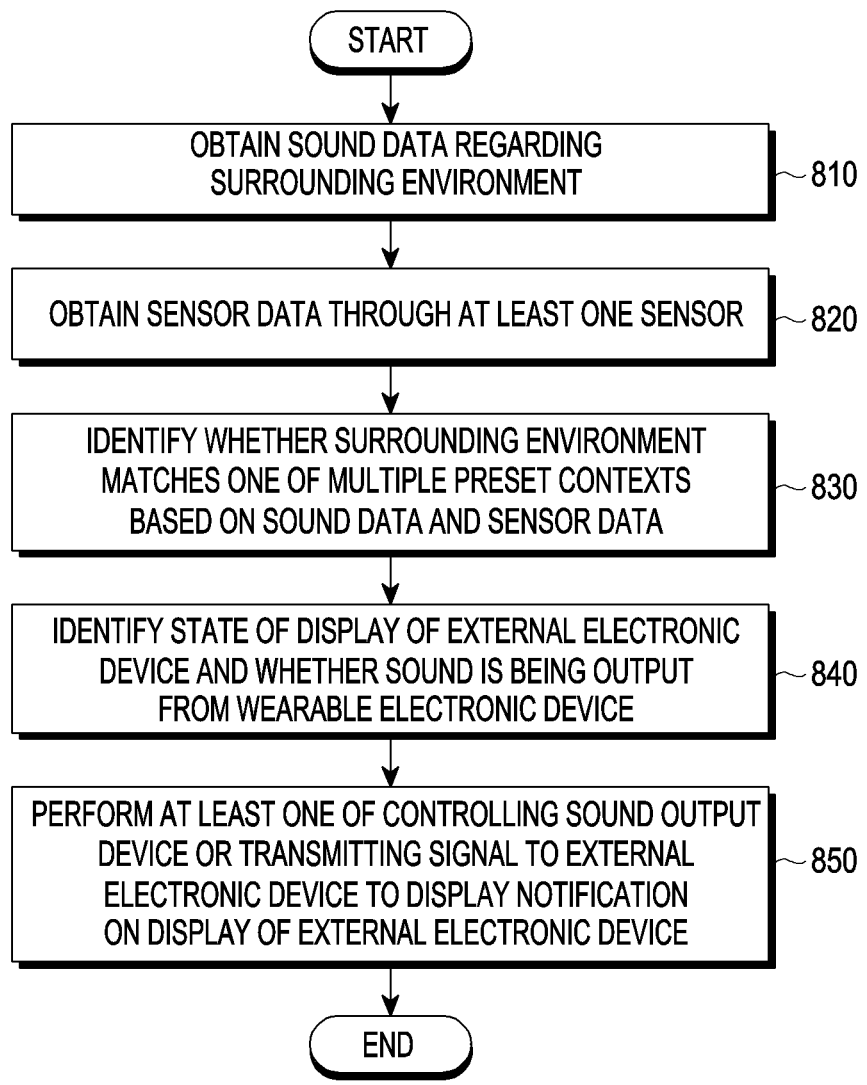
FIG. 8 illustrates operations performed in a wearable electronic device according to an embodiment of the disclosure.

FIG. 8 illustrates operations performed in a wearable electronic device according to an embodiment of the disclosure.

Referring to FIG. 8, in operation 810, at least one processor (e.g., the processor 740) of a wearable electronic device (e.g., the wearable electronic device 700) may obtain sound data regarding the surrounding environment through the sound input device 710.

In operation 820, the at least one processor 740 may obtain sensor data through at least one sensor (e.g., the sensor 750).

In operation 830, the at least one processor 740 may identify whether the surrounding environment matches one of a plurality of preset contexts based on the sound data and the sensor data. Details regarding operation 330 of FIG. 3 may be applied to operation 830. Operation 330 of FIG. 3 differs from operation 830 in that operation 330 of FIG. 3 is performed by the electronic device (e.g., the electronic device 101) interacting with the wearable electronic device 700, and operation 830 is performed by the wearable electronic device 700.

In operation 840, the at least one processor 740 determines the state of the display (e.g., the display module 160) of an external electronic device (e.g., the electronic device 101) and whether sound is being output through the sound output device 720 of the wearable electronic device 700. The at least one processor 740 may receive information regarding the display 160 from the external electronic device 101 through the communication circuit 730, identifying the state of the display 160. According to various embodiments of the disclosure, the state of the display 160 may include an off state of the display 160 and an on state of the display 160.

Like in operation 340, identifying whether sound is being output through the sound output device 720 of the wearable electronic device 700 may mean identifying whether sound to be recognized by the user, like a sound corresponding to music or video, is being output.

In operation 850, the at least one processor 740 may perform at least one of controlling the sound output device 720 or transmitting, to the external electronic device, a signal to display a notification on the display 160 of the external electronic device 101. The details of operation 350 of FIG. 3 may apply to operation 850. However, displaying on the display 160 regarding operation 350 may be replaced by transmitting, to the external electronic device 101, a signal to allow the external electronic device 101 to display on the display 160 in operation 850. Transmitting, to the wearable electronic device 200, a control signal to allow the wearable electronic device 200 to perform a specific operation in operation 350 may be replaced by controlling the sound output device 720 to allow the at least one processor 740 to perform a specific operation in operation 850.

Figure 9:
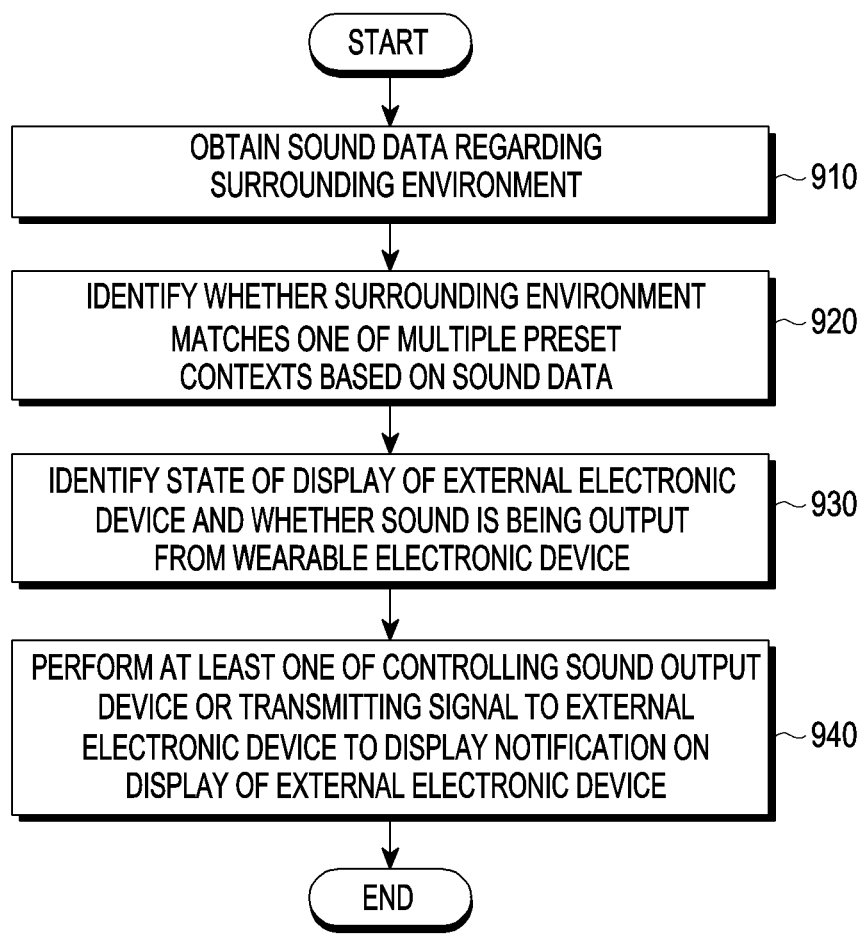
FIG. 9 illustrates operations performed in a wearable electronic device according to an embodiment of the disclosure.

FIG. 9 illustrates operations performed in a wearable electronic device according to an embodiment of the disclosure.

Referring to FIG. 9, in operation 910, at least one processor (e.g., the processor 740) of a wearable electronic device (e.g., the wearable electronic device 700) may obtain sound data regarding the surrounding environment through the sound input device 710.

In operation 920, the at least one processor 740 may identify whether the surrounding environment matches one of a plurality of preset contexts based on the sound data. Details regarding operation 420 of FIG. 4 may be applied to operation 920. Operation 420 of FIG. 4 differs from operation 920 in that operation 330 of FIG. 3 is performed by the electronic device (e.g., the electronic device 101) interacting with the wearable electronic device 700, and operation 830 is performed by the wearable electronic device 700.

In operation 930, the at least one processor 740 determines the state of the display (e.g., the display module 160) of an external electronic device (e.g., the electronic device 101) and whether sound is being output through the sound output device 720 of the wearable electronic device 700. Details regarding operation 840 of FIG. 8 may be applied to operation 930.

In operation 940, the at least one processor 740 may perform at least one of controlling the sound output device 720 or transmitting, to the external electronic device, a signal to display a notification on the display 160 of the external electronic device 101. The details of operation 440 of FIG. 4 may apply to operation 940. However, displaying on the display 160 regarding operation 440 may be replaced by transmitting, to the external electronic device 101, a signal to allow the external electronic device 101 to display on the display 160 in operation 940. Transmitting, to the wearable electronic device 200, a control signal to allow the wearable electronic device 200 to perform a specific operation in operation 440 may be replaced by controlling the sound output device 720 to allow the at least one processor 740 to perform a specific operation in operation 940.

Figure 10:
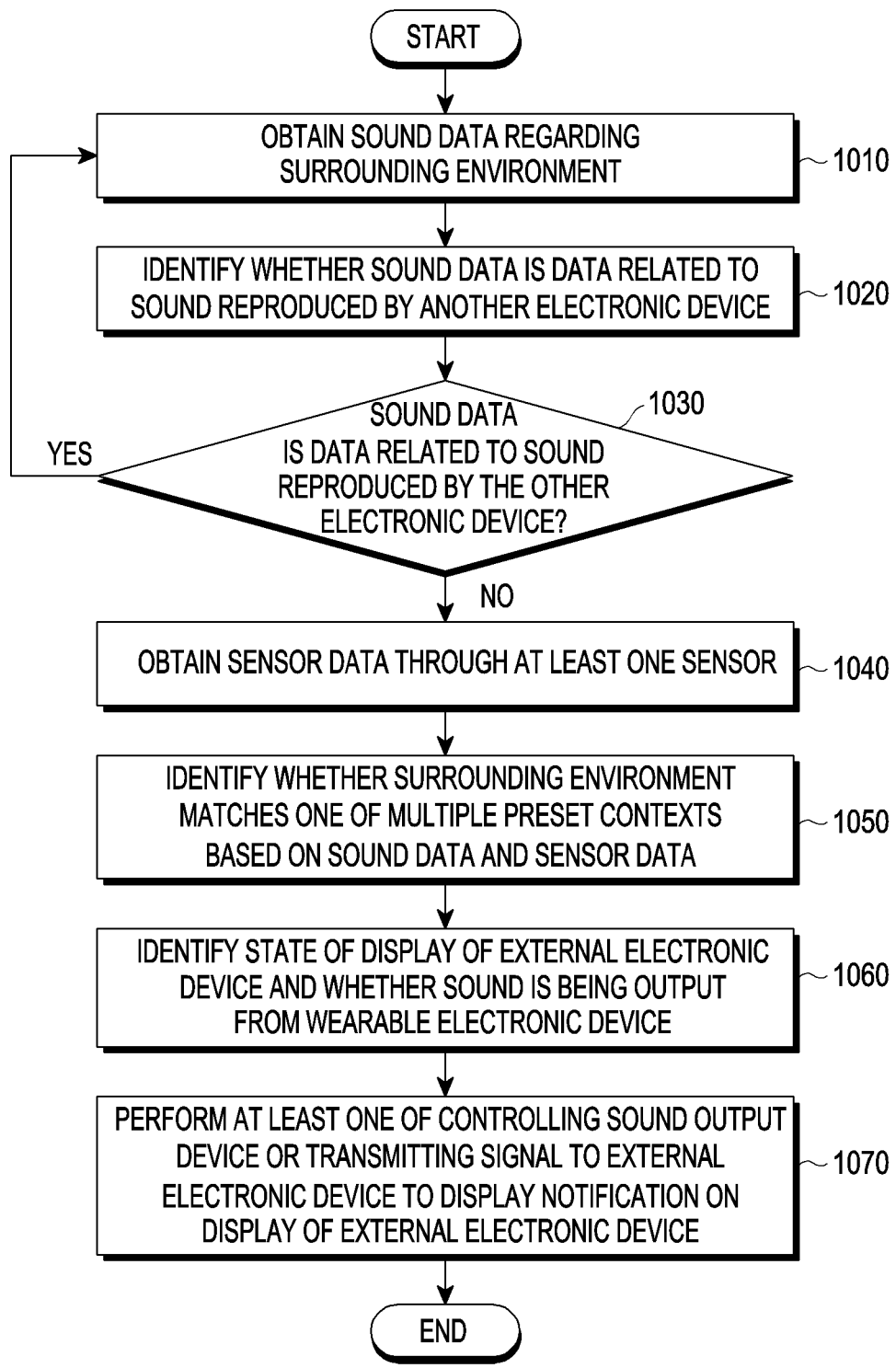
FIG. 10 illustrates operations performed in a wearable electronic device according to an embodiment of the disclosure.

FIG. 10 illustrates operations performed in a wearable electronic device according to an embodiment of the disclosure.

Referring to FIG. 10, in operation 1010, at least one processor (e.g., the processor 740) of a wearable electronic device (e.g., the wearable electronic device 700) may obtain sound data regarding the surrounding environment through the sound input device 710.

In operation 1020, the at least one processor 740 may identify whether the sound data is data related to the sound reproduced by an electronic device other than the wearable electronic device 700. Details regarding operation 520 of FIG. 5 may be applied to operation 1020. Operation 520 differs from operation 1020 in that operation 520 is performed by at least one processor 120 of the electronic device 101, and operation 1020 is performed by at least one processor 740 of the wearable electronic device 700.

When it is determined in operation 1030 that the sound data is data related to the sound reproduced by an electronic device other than the wearable electronic device 700, the at least one processor 740 may repeat operation 1010 through operation 1030 until sound data related to an actually existing noise source is identified. In other words, in determining the surrounding environment, the at least one processor 740 may not utilize the sound data related to the sound reproduced by the other electronic device.

When it is determined in operation 1030 that the sound data is not data related to the sound reproduced by an electronic device other than the wearable electronic device 700, the at least one processor 740 may perform operation 1040. In operation 540, the at least one processor 740 may obtain sensor data through at least one sensor (e.g., the sensor 750).

In operation 1050, the at least one processor 740 may identify whether the surrounding environment matches one of a plurality of preset contexts based on the sound data and the sensor data. Details regarding operation 830 of FIG. 8 may be applied to operation 1050.

In operation 1060, the at least one processor 740 determines the state of the display (e.g., the display module 160) of an external electronic device (e.g., the electronic device 101) and whether sound is being output through the sound output device 720 of the wearable electronic device 700. Details regarding operation 840 of FIG. 8 may be applied to operation 1060.

In operation 1070, the at least one processor 740 may perform at least one of controlling the sound output device 720 or transmitting, to the external electronic device, a signal to display a notification on the display 160 of the external electronic device 101. Details regarding operation 850 of FIG. 8 may be applied to operation 1070.

According to various embodiments of the disclosure, when determining the surrounding environment, the wearable electronic device 700 may consider only sound data related to the actually existing noise source while disregarding the sound data related to the sound reproduced by the other electronic device than the wearable electronic device 700. Since the noise generated by content being reproduced by the other electronic device does not represent the surrounding environment of the wearable electronic device 700, the wearable electronic device 700 may disregard the sound data related to the sound reproduced by the other electronic device, thereby accurately determining the surrounding environment.

Figure 11:
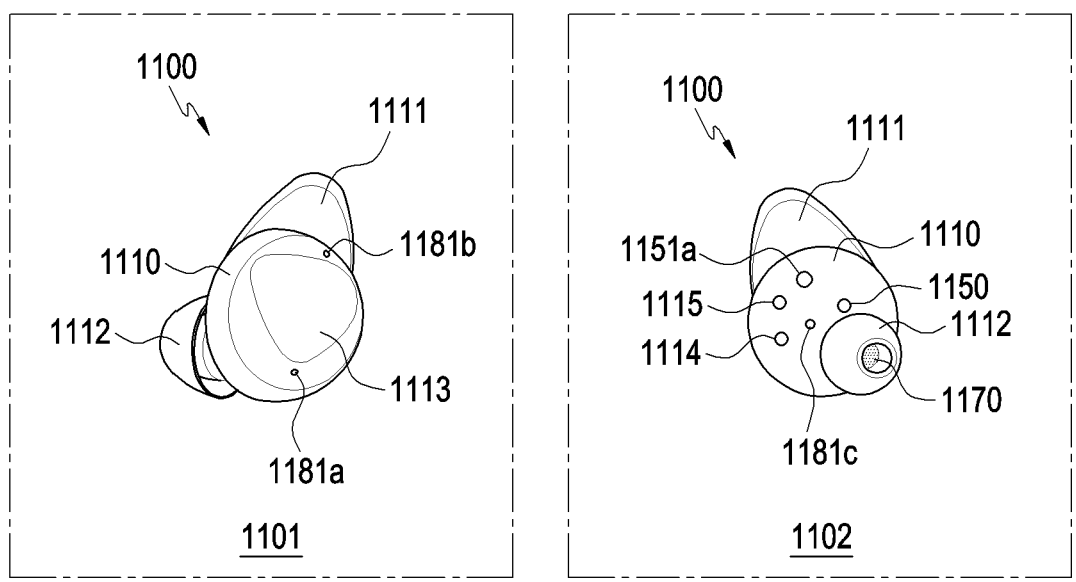
FIG. 11 illustrates a front view and a rear view of a first wireless audio device that may be included in a wearable electronic device according to an embodiment of the disclosure.

FIG. 11 illustrates a front view and a rear view of a first wireless audio device that may be included in a wearable electronic device according to an embodiment of the disclosure.

Referring to FIG. 11, a structure of a first wireless audio device 1100 that may be included in the wearable electronic device 200 is described with reference to FIG. 11. For convenience of description, a duplicate description is omitted, but the wearable electronic device 200 may further include a second wireless audio device (not shown) having the same or similar structure to the first wireless audio device 1100.

Reference numeral 1101 denotes a front view of the first wireless audio device 1100. The first wireless audio device 1100 may include a housing 1110. The housing 1110 may form at least a portion of the exterior of the first wireless audio device 1100. The housing 1110 may include a button 1113 and a plurality of microphones 1181*a* and 1181*b* disposed on a first surface (e.g., the surface facing the outside when worn). The button 1113 may be configured to receive a user input (e.g., a touch input or a push input). The first microphone 1181*a* and the second microphone 1181*b* may be included in the audio reception circuit 1181 of FIG. 3. The first microphone 1181*a* and the second microphone 1181*b* may be arranged to detect sound in a direction toward the outside of the user when the first wireless audio device 1100 is worn. The first microphone 1181*a* and the second microphone 1181*b* may be referred to as external microphones. The first microphone 1181*a* and the second microphone 1181*b* may detect sound outside the housing 1110. For example, the first microphone 1181*a* and the second microphone 1181*b* may detect sound generated from the surroundings of the first wireless audio device 1100. The sound of the surrounding environment detected by the first wireless audio device 1100 may be output by the speaker 1170. In an embodiment of the disclosure, the first microphone 1181*a* and the second microphone 1181*b* may be sound-pickup microphones for a noise canceling function (e.g., active noise cancellation (ANC)) of the first wireless audio device 1100. Further, the first microphone 1181*a* and the second microphone 1181*b* may be sound pickup microphones for the function of hearing ambient sound (e.g., a transparency function or an ambient aware function) of the first wireless audio device 1100. For example, the first microphone 1181*a* and the second microphone 1181*b* may include various types of microphones including electronic condenser microphones (ECMs) and micro electro mechanical system (MEMS) microphones. A wing tip 1111 may be coupled to the circumference of the housing 1110. The wing tip 1111 may be formed of an elastic material. The wing tip 1111 may be detached from the housing 1110 or attached to the housing 1110. The wingtip 1111 may enhance wearability of the first wireless audio device 1100.

Reference numeral 1102 denotes a rear view of the first wireless audio device 1100. The housing 1110 may include a first electrode 1114, a second electrode 1115, a proximity sensor 1150, a third microphone 1181c, and a speaker 1170 disposed on a second surface (e.g., the surface facing the user when worn). The speaker 1170 may be included in the audio output circuit 1171 of FIG. 3. The speaker 1170 may convert an electrical signal into a sound signal. The speaker 1170 may output sound to the outside of the first wireless audio device 1100. For example, the speaker 1170 may convert an electrical signal into a sound that the user may audibly recognize and output the electrical signal. At least a portion of the speaker 1170 may be disposed inside the housing 1110. The speaker 1170 may be coupled to the ear tip 1112 through one end of the housing 1110. The ear tip 1112 may be formed in a cylindrical shape with a hollow formed therein. For example, when the ear tip 1112 is coupled with the housing 1110, the sound (audio) output from the speaker 1170 may be transferred to an external object (e.g., the user) through the hollow of the ear tip 1112.

According to an embodiment of the disclosure, the first wireless audio device 1100 may include a sensor 1151a (e.g., an acceleration sensor, a bone conduction sensor, and/or a gyro sensor) disposed on the second surface of the housing 1110. The position and shape of the sensor 1151a illustrated in FIG. 11 are not limited thereto. For example, the sensor 1151a may be disposed inside the housing 1110 not to be exposed to the outside. The sensor 1151a may be located in a position capable of contacting the wearer's ear or in a portion of the housing 1110 in contact with the wearer's ear when worn.

The ear tip 1112 may be formed of an elastic material (or a flexible material). The ear tip 1112 may assist the first wireless audio device 1100 to be tightly inserted into the user's ear. For example, the ear tip 1112 may be formed of a silicone material. At least one area of the ear tip 1112 may be deformed according to the shape of the external object (e.g., the shape of the ear kernel). According to various embodiments of the disclosure, the ear tip 1112 may be formed by a combination of at least two of silicone, foam, and plastic material. For example, the area of the ear tip 1112 that is inserted into and touches the user's ear may be formed of a silicone material, and the area into which the housing 1110 is inserted may be formed of a plastic material. The ear tip 1112 may be detached from the housing 1110 or attached to the housing 1110. The first electrode 1114 and the second electrode 1115 may be connected with an external power source (e.g., a case) and may receive electrical signals from the external power source. The proximity sensor 1150 may be used to detect the user's wearing state. The proximity sensor 1150 may be disposed inside the housing 1110. At least a portion of the proximity sensor 1150 may be disposed to be exposed to the exterior of the first wireless audio device 1100. The first wireless audio device 1100 may determine whether the first wireless audio device 1100 is worn by the user based on the data measured by the proximity sensor 1150. For example, the proximity sensor 1150 may include an IR sensor. The IR sensor may detect whether the housing 1110 contacts the user's body, and the first wireless audio device 1100 may determine whether the first wireless audio device 1100 is worn based on the detection by the IR sensor. The proximity sensor 1150 is not limited to an IR sensor and may be implemented using various types of sensors (e.g., an acceleration sensor or a gyro sensor). The third microphone 1181c may be arranged to detect sound in a direction toward the user when the first wireless audio device 1100 is worn. The third microphone 1181c may be referred to as an internal microphone.

Figure 12:
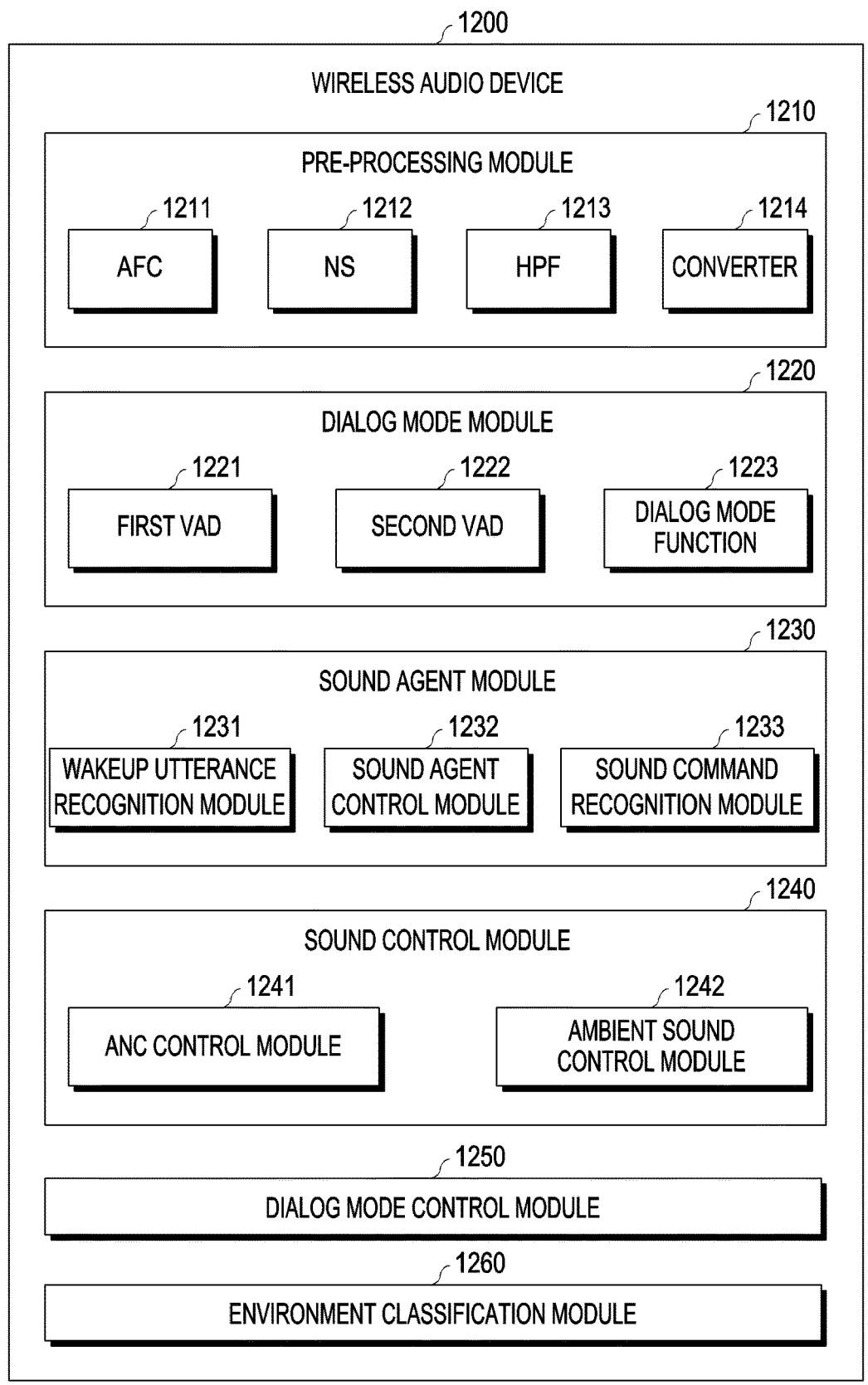
FIG. 12 is a block diagram illustrating a wireless audio device according to an embodiment of the disclosure.

FIG. 12 is a block diagram illustrating a wireless audio device according to an embodiment of the disclosure.

Referring to FIG. 12, according to various embodiments of the disclosure, a wireless audio device 1200 may be a type of the wearable electronic device 200. The components of the wireless audio device 1200 of FIG. 12 may include example software modules. For example, the above-described components may be implemented by the first wireless audio device 1100 or the second wireless audio device. At least some of the components may be omitted. At least some of the components may be implemented as one software module. The components are logically so divided and may correspond to any program, thread, application, or code that performs the same function.

A pre-processing module 1210 may perform pre-processing on the sound (audio) (or audio signal) received using an audio reception circuit (e.g., the sound input device 210 of FIG. 2). For example, the pre-processing module 1210 may cancel the echo of the obtained audio signal using an acoustic echo canceller (AEC) 1211. The pre-processing module 1210 may reduce the noise of the obtained audio signal using a noise suppression (NS) 1212. The pre-processing module 1210 may reduce the signal of a designated band of the obtained audio signal using a high pass filter (HPF) 1213. The pre-processing module 1210 may change the sampling rate of the audio input signal using a converter 1214. For example, the converter 1214 may be configured to perform downsampling or upsampling on the audio input signal. The pre-processing module 1210 may selectively apply at least one of the AEC 1211, the NS 1212, the HPF 1213, or the converter 1214 to the audio signal.

A dialog mode module 1220 may determine whether to start and end a dialog mode. For example, the dialog mode module 1220 may detect whether the wearer (e.g., the user) of the wireless audio device 1200 utters using a first voice activity detection (VAD) 1221. The dialog mode module 1220 may detect whether the wearer utters and an outsider utters using a second VAD 1222. The dialog mode module 1220 may identify and/or specify the wearer's utterance duration through the first VAD 1221. The dialog mode module 1220 may identify and/or specify the outsider's utterance duration through the first VAD 1221 and the second VAD 1222. For example, the dialog mode module 1220 may identify and/or specify the outsider's utterance duration by excluding the duration in which the wearer's utterance is identified through the first VAD 1221, of the duration in which utterance is identified through the second VAD 1222. The dialog mode module 1220 may determine whether to execute and terminate a sound agent using the first VAD 1221, the second VAD 1222, and the dialog mode function 1223.

According to an embodiment of the disclosure, the dialog mode module 1220 may detect whether the user utters and whether the outsider utters, using the first VAD 1221 and the second VAD 1222. In an example, the dialog mode module 1220 may perform at least one of the first VAD 1221 or the second VAD 1222 using the audio signal pre-treated by the pre-processing module 1210 or the audio signal not processed by the pre-processing module 1210. The wireless audio device 1200 may detect a motion of the wireless audio device 1200 using a sensor 1551a (e.g., a motion sensor, an acceleration sensor, and/or a gyro sensor). As an example, if an audio signal (e.g., a sound signal) of a designated magnitude or more is detected in a designated band (e.g., the human voice frequency band), the wireless audio device 1200 may detect the sound signal from the audio signal. When a designated motion is detected during, simultaneously, or substantially simultaneously with the detection of the sound signal, the wireless audio device 1200 may detect the user's utterance (e.g., wearer's utterance) based on the sound signal. For example, the designated motion may be a motion detected by the wireless audio device 1200 due to the utterance of the wearer of the wireless audio device 1200. For example, the motion due to the wearer's utterance, in the form of a motion or vibration, may be transferred to the motion sensor, acceleration sensor, and/or gyro sensor. The motion due to the wearer's utterance may be introduced to the motion sensor, acceleration sensor, and/or gyro sensor, as is a bone conductance microphone input. The wireless audio device 1200 may obtain information about the start and end times of the wearer's utterance based on the designated motion and the sound signal. When the designated motion is not detected during, simultaneously, or substantially simultaneously with the detection of the sound signal, the wireless audio device 1200 may detect the outsider's utterance (e.g., an utterance from a person (e.g., an outside or the counterpart) other than the wearer) based on the sound signal. The wireless audio device 1200 may obtain information about the start and end times of the outsider's utterance based on the designated motion and the sound signal. The dialog mode module 1220 may store the information about the start and end times of the user's utterance or the outsider's utterance in the memory and determine whether to start or end the dialog mode based on the information stored in the memory.

For example, the first VAD 1221 and the second VAD 1222 may be serial processes. When a sound signal is detected using the second VAD 1222, the wireless audio device 1200 may detect motion using a motion sensor (e.g., an acceleration sensor and/or a gyro sensor), thereby identifying whether the sound signal corresponds to the user's utterance.

For example, the first VAD 1221 and the second VAD 1222 may be parallel processes. For example, the first VAD 1221 may be configured to detect the user's utterance independently of the second VAD 1222. The second VAD 1222 may be configured to detect the sound signal regardless of whether the user utters.

For example, the wireless audio device 1200 may use different microphones in detecting the user's utterance and the outsider's utterance. The wireless audio device 1200 may use an external microphone (e.g., the first microphone 1181a and the second microphone 1181b of FIG. 11) to detect the outsider's utterance. The wireless audio device 1200 may use an internal microphone (e.g., the third microphone 1181c of FIG. 11) to detect the user's utterance. When using the internal microphone, the electronic device 1200 may determine whether the wearer utters based on the motion information and the sound signal which is based on the internal microphone. To detect the user's utterance, the wireless audio device 1200 may determine whether the wearer utters based on the sound signal introduced as a sensor input. The signal introduced as the sensor input may include at least one of an acceleration sensor input or a gyro sensor input.

According to an embodiment of the disclosure, the dialog mode module 1220 may determine to start the dialog mode using the first VAD 1221 and/or the second VAD 1222. In the dialog mode OFF state, the dialog mode module 1220 may determine whether to start the dialog mode. For example, the dialog mode module 1220 may determine to start the dialog mode when the user's utterance is maintained for a designated time period. As another example, the dialog mode module 1220 may determine to start the dialog mode when the counterpart's utterance is maintained for a designated time period after the user's utterance is terminated.

According to an embodiment of the disclosure, the dialog mode module 1220 may determine whether to maintain or terminate the dialog mode using the first VAD 1221 and/or the second VAD 1222. In the dialog mode ON state, the dialog mode module 1220 may determine whether to maintain or terminate the dialog mode. For example, during the dialog mode, the dialog mode module 1220 may determine to end the dialog mode if no sound signal is detected for a designated time period. During the dialog mode, the dialog mode module 1220 may determine to maintain the dialog mode when a sound signal is detected within a designated time period from the end of the previous sound signal.

According to an embodiment of the disclosure, the dialog mode module 1220 may determine whether to start and/or end the dialog mode based on the dialog mode function 1223. The dialog mode function 1223 may detect a dialog mode start and/or end based on a user input. For example, the user input may include the user's sound command, the user's touch input, or the user's button input.

According to an embodiment of the disclosure, the dialog mode module 1220 may determine the length of the designated time period based on the ambient sound. For example, the dialog mode module 1220 may determine the length of the designated time period based on at least one of the background noise sensitivity, signal to noise ratio (SNR) value or noise type of the sound obtained by an external microphone. In a noisy environment, the dialog mode module 1220 may increase the length of the designated time period.

According to an embodiment of the disclosure, the dialog mode module 1220 may determine whether to start and/or end the dialog mode based on the user's sound command. In one example, the sound agent module 1230 may detect the user's sound command instructing to start the dialog mode and transfer, to the dialog mode function 1223, information indicating the start of the dialog mode in response to detection of the sound command. The sound command instructing to start the dialog mode may include a sound command and a wakeup utterance (e.g., Hi Bixby) to wake up the sound agent. For example, the sound command may have a form, such as "Hi Bixby. Start dialog mode". As another example, the sound command instructing to start the dialog mode may have a form, such as "Start dialog mode," which does not include a wakeup utterance. When the dialog mode function 1223 receives information indicating the start of the dialog mode from the sound agent module 1230, the dialog mode module 1220 may determine to start the dialog mode. In one example, the sound agent module 1230 may detect the user's sound command instructing to end the dialog mode and transfer, to the dialog mode function 1223, information indicating the end of the dialog mode in response to detection of the sound command. For example, the sound command instructing to end the dialog mode may include a sound command and a wakeup utterance to wake up the sound agent. The sound command may have a form, such as "Hi Bixby. End dialog mode". For example, the sound command instructing to end the dialog mode may have a form, such as "End dialog mode," which does not include a wakeup utterance. When the dialog mode function 1223 receives information indicating the end of the dialog mode from the sound agent module 1230, the dialog mode module 1220 may determine to end the dialog mode.

According to an embodiment of the disclosure, the dialog mode module 1220 may determine whether to start and/or end the dialog mode based on the user's touch input. For example, the electronic device 101 may provide a UI for controlling the dialog mode of the wireless audio device 1200. Through the UI, the electronic device 101 may receive a user input for setting activation or deactivation of the dialog mode. If the user input instructing activation of the dialog mode is received, the electronic device 101 may transmit a signal instructing to start the dialog mode to the wireless audio device 1200. If the dialog mode function 1223 receives information indicating the start of the dialog mode from the signal, the dialog mode module 1220 may determine to start the dialog mode. If a user input instructing deactivation of the dialog mode is received through the UI, the electronic device 101 may transmit a signal instructing to end the dialog mode to the wireless audio device 1200. If the dialog mode function 1223 obtains information indicating the end of the dialog mode from the signal, the dialog mode module 1220 may determine to end the dialog mode.

According to an embodiment of the disclosure, if the dialog mode module 1230 determines to start or end the dialog mode, the wireless audio device 1200 transmits a signal indicating that the start or end of the dialog mode has been determined to the electronic device 101. The electronic device 101 may provide information indicating that the start or end of the dialog mode has been determined, obtained from the signal, through the UI for controlling the dialog mode of the wireless audio device 1200.

According to an embodiment of the disclosure, the dialog mode module 1220 may determine whether to start and/or end the dialog mode based on the user's button input. For example, the wireless audio device 1200 may include at least one button (e.g., the button 1113 of FIG. 11). The dialog mode function 1223 may be configured to detect a designated input (e.g., a double tap or a long press) to the button. If an input instructing to start the dialog mode is received through the button, the dialog mode module 1220 may determine to start the dialog mode. If an input instructing to end the dialog mode is received through the button, the dialog mode module 1220 may determine to end the dialog mode.

According to an embodiment of the disclosure, the dialog mode function 1223 may be configured to interact with the sound agent module 1230. For example, the dialog mode function 1223 may obtain information indicating whether the utterance is for a sound agent invocation from the sound agent module 1230. For example, the wearer's utterance maintained for a designated time or longer may be detected by the first VAD 1221. In this case, the dialog mode module 1220 may identify whether the wearer's utterance is for the invocation of the sound agent using the dialog mode function 1223. When the dialog mode function 1223 identifies, using the sound agent module 1230, that the sound agent invocation has been performed by the corresponding utterance, the dialog mode module 1220 may disregard the corresponding utterance. For example, even when the corresponding utterance lasts for a designated time or longer, the dialog mode module 1220 may not determine to start the dialog mode only with the corresponding utterance. For example, the sound agent module 1230 may identify a sound command instructing to start the dialog mode from the corresponding utterance. In this case, the sound agent module 1230 may transfer the signal instructing to start the dialog mode to the dialog mode module 1220, and the dialog mode module 1220 may determine to start the dialog mode. In other words, in this case, the dialog mode module 1220 may determine to start the dialog mode based on the instruction of the sound agent module 1230 rather than the length of the utterance itself.

According to an embodiment of the disclosure, the dialog mode module 1220 may determine to end the dialog mode based on the operation time of the dialog mode. For example, after a predetermined time elapses after the dialog mode is turned on, the dialog mode module 1220 may determine to end the dialog mode.

According to an embodiment of the disclosure, the sound agent module 1230 may include a wakeup utterance recognition module 1231 and a sound agent control module 1232. In one example, the sound agent module 1230 may further include a sound command recognition module 1233. The wakeup utterance recognition module 1231 may obtain an audio signal using the audio reception circuit 210 and may recognize a wakeup utterance (e.g., Hi Bixby) from the audio signal. If a designated sound command is recognized, the wakeup utterance recognition module 1231 may control the sound agent using the sound agent control module 1232. For example, the sound agent control module 1232 may transfer the received sound signal to the electronic device (e.g., the electronic device 101) and may receive a task or command corresponding to the sound signal from the electronic device 101. For example, when the sound signal instructs to adjust the volume, the electronic device 101 may transfer a signal instructing to adjust the volume to the wireless audio device 1200. The sound command recognition module 1233 may obtain an audio signal using the audio reception circuit 210 and may recognize a designated sound command from the audio signal. In one example, the designated sound utterance may include a sound command (e.g., start dialog mode, end dialog mode) for controlling the dialog mode. The sound command recognition module 1233 may perform the function corresponding to the designated sound command if the designated sound command is recognized even without recognizing the wakeup utterance. For example, the sound command recognition module 1233 may transmit a signal instructing to end the dialog mode to the electronic device 101 if recognizing an utterance of a designated command, such as "end dialog mode". For example, the sound command recognition module 1233 may perform the function corresponding to the designated sound command without interaction with the sound agent. The electronic device 101 may perform sound control of the wireless audio device 1200, which is described below, in response to the signal instructing to end the dialog mode.

According to an embodiment of the disclosure, the dialog mode module 1220 may transfer the determination for the dialog mode (e.g., the end of the dialog mode or the start of the dialog mode) to the dialog mode control module 1250. The dialog mode control module 1250 may control the function of the wireless audio device 1200 according to activation and/or deactivation of the dialog mode. For example, the dialog mode control module 1250 may control the output sound of the wireless audio device 1200 using the sound control module 1240 according to activation and/or deactivation of the dialog mode.

For example, the sound control module 1240 may include an active noise canceling (ANC) module 1241 and an ambient sound control module 1242. The ANC module 1241 may be configured to obtain ambient sound and perform noise cancellation based on the ambient sound. For example, the ANC module 1241 may obtain ambient sound using an external microphone and perform noise cancellation using the obtained ambient sound. The ambient sound control module 1242 may be configured to provide ambient sounds to the wearer. For example, the ambient sound control module 1242 may be configured to obtain ambient sound using an external microphone and output the obtained ambient sound using the speaker of the wireless audio device 1200, providing the ambient sound.

According to an embodiment of the disclosure, if the dialog mode starts, the dialog mode control module 1250 may control the output sound of the wireless audio device 1200 using the sound control module 1240. For example, the dialog mode control module 1250 may deactivate the ANC to activate the ambient sound in response to the start of the dialog mode. As another example, when music is being output from the wireless audio device 1200, the dialog mode control module 1250 may reduce the volume level of the music being output by a predetermined rate or more or set it to mute in response to the start of the display mode. The user of the wireless audio device 1200 may clearly hear ambient sounds as the dialog mode starts.

According to an embodiment of the disclosure, if the dialog mode ends, the dialog mode control module 1250 may control the output sound of the wireless audio device 1200 using the sound control module 1240. For example, the dialog mode control module 1250 may restore the ANC settings and/or the ambient sound settings to the settings before the dialog mode starts in response to the end of the dialog mode and deactivate the ambient sound. For example, before starting the dialog mode, the dialog mode control module 1250 may store the ANC settings and/or the ambient sound settings in the memory. If the display mode ends, the dialog mode control module 1250 may activate or deactivate ANC and/or ambient sound depending on the ANC settings and/or ambient sound settings stored in the memory.

As another example, the dialog mode control module 1250 may restore the output sound of the wireless audio device 1200 to the settings before the dialog mode starts, in response to the end of the dialog mode. For example, when music is being output from the wireless audio device 1200 before the dialog mode starts, the dialog mode control module 1250 may store music output sound settings in the memory. If the dialog mode ends, the dialog mode control module 1250 may restore the music output sound to the music output sound settings stored in the memory. The dialog mode control module 1250 may reduce the media output volume to a designated value or mute, according to the settings, in the dialog mode. In the dialog mode, the wireless audio device 1200 may output a notification (e.g., a response to the user's utterance) of the sound agent, independently of the volume of the dialog mode. For example, the wireless audio device 1200 may output a notification (e.g., a TTS-based response) of the sound agent, in a designated volume value in the dialog mode.

According to an embodiment of the disclosure, the dialog mode control module 1250 may control the output sound using the sound control module 1240 during the operation of the dialog mode. For example, the dialog mode control module 1250 may control the intensity of the ANC and/or ambient sound. The dialog mode control module 1250 may control the gain value of the ambient sound to amplify the intensity of the ambient sound. The dialog mode control module 1250 may amplify only the section in which a sound exists in the ambient sound or a frequency band corresponding to a sound. In the dialog mode, the dialog mode control module 1250 may reduce the intensity of ANC. The dialog mode control module 1250 may control the output volume of the audio signal.

Tables 7 and 8 below show examples of sound control of the dialog mode control module 1250 according to the start (e.g., ON) and end (e.g., OFF) of the dialog mode.

TABLE 7

| sound control | previous state | dialog mode ON | dialog mode OFF |
|---|---|---|---|
| ANC | ON | OFF | ON |
| ambient sound | OFF | ON | OFF |

Referring to Table 7, the wearer of the wireless audio device 1200 may be listening to music using the wireless audio device 1200. For example, the wireless audio device 1200 may output music while performing ANC. For example, the wireless audio device 1200 may output music in a first volume. As the dialog mode starts, the dialog mode control module 1250 may activate ambient sound and deactivate ANC. In this case, the dialog mode control module 1250 may reduce the volume of the music being output to a designated value or less or may decrease it by a designated rate. For example, the dialog mode control module 1250 may reduce the volume of the music being output to a second value in the dialog mode. As the dialog mode ends, the dialog mode control module 1250 may restore settings related to the output sound. For example, the dialog mode control module 1250 may activate ANC and deactivate ambient sound. Further, the dialog mode control module 1250 may increase the volume of the music being output to the first value.

TABLE 8

| sound control | previous state | dialog mode ON | dialog mode OFF |
|---|---|---|---|
| ANC | OFF | OFF | OFF |
| ambient sound | OFF | ON | OFF |

Referring to Table 8, the wearer of the wireless audio device 1200 may be listening to music using the wireless audio device 1200. For example, the wireless audio device 1200 may output music without applying ANC. For example, the wireless audio device 1200 may output music in a first volume. As the dialog mode starts, the dialog mode control module 1250 may activate ambient sound and keep ANC inactive. In this case, the dialog mode control module 1250 may reduce the volume of the music being output to a designated value or less or may decrease it by a designated rate. For example, the dialog mode control module 1250 may reduce the volume of the music being output to a second value in the dialog mode. As the dialog mode ends, the dialog mode control module 1250 may restore settings related to the output sound. For example, the dialog mode control module 1250 may keep ANC inactive and deactivate ambient sound. Further, the dialog mode control module 1250 may increase the volume of the music being output to the first value.

In the examples of Tables 7 and 8, it has been described that the wireless audio device 1200 deactivates the ambient sound when the dialog mode is not set, but embodiments of the disclosure are not limited thereto. For example, even when the dialog mode is not set, the wireless audio device 1200 may activate ambient sound according to the user's settings.

According to an embodiment of the disclosure, an environment classification module 1260 may obtain an audio signal using an audio reception circuit and classify the environment based on the audio signal. For example, the environment classification module 1260 may obtain at least one of background noise, signal to noise ratio (SNR), or noise type from the audio signal. The environment classification module 1260 may detect the environment based on the intensity of the background noise, the SNR, or the noise type. For example, the environment classification module 1260 may identify the environment of the wireless audio device 1200 by comparing the environment information stored in the memory with at least one of background noise intensity, SNR, and noise type. For example, the environment classification module 1260 may control the output sound based on the identified environment.

For example, in a state in which the dialog mode is activated, the environment classification module 1260 may control the output sound based on the identified environment. The environment classification module 1260 may control the ambient sound based on the intensity and/or SNR of the background noise. For example, the environment classification module 1260 may determine to amplify the overall output of the ambient sound or the sound band of the ambient sound or amplify a designated sound (e.g., alarm or siren) of the ambient sound. For example, the environment classification module 1260 may determine the intensity of ANC. For example, the environment classification module 1260 may adjust parameters (e.g., coefficients) of a filter for ANC. In the above-described example, the environment classification module 1260 identifies the environment using the audio signal, but embodiments of the disclosure are not limited thereto. For example, the environment classification module 1260 may identify the environment based on Wi-Fi information and/or GPS information.

According to an embodiment of the disclosure, the environment classification module 1260 may control the dialog mode based on the identified environment. For example, the environment classification module 1260 may activate the dialog mode based on the identified environment. If the environment classification module 1260 determines that the user is in an environment in which ambient sounds are to be heard, the environment classification module 1260 may activate the dialog mode using the dialog mode control module 1250 and provide the ambient sound to the user according to the dialog mode. For example, when the user is in a dangerous environment (e.g., an environment in which a siren sound is detected), the environment classification module 1260 may activate the dialog mode.

According to an embodiment of the disclosure, the electronic device 101 may display a user interface indicating the end or start of the dialog mode on the display 360. The electronic device 101 may provide the user interface in a manner synchronized with the dialog mode of the wireless audio device 1200. The electronic device 101 may display the user interface when the electronic device 101 determines to end or start the dialog mode or receives a signal instructing to end or start the dialog mode from the wireless audio device 1200. For example, if the dialog mode starts, the electronic device 101 may display a first user interface including information indicating that the dialog mode is set. The first user interface may include an interface for controlling output sound settings in the dialog mode. For example, if the dialog mode ends, the electronic device 101 may display a second user interface including information indicating that the dialog mode is terminated. The electronic device 101 may display the first user interface and the second user interface on an execution screen of an application (e.g., a wearable application) for controlling the wireless audio device 1200.

According to an embodiment of the disclosure, the dialog mode module 1220 may determine to start and end the dialog mode based on whether it is worn. For example, when the wireless audio device 1200 is worn by the user, the dialog mode module 1220 may start the dialog mode based on the user's (e.g., wearer's) utterance or user input. When the wireless audio device 1200 is not worn by the user, the dialog mode module 1220 may not start the dialog mode even when the user's utterance is detected.

For example, each of the first wireless audio device 1100 and the second wireless audio device (not shown) may include the components of the wireless audio device 1200 shown in FIG. 12. Each of the first wireless audio device 1100 and the second wireless audio device may be configured to determine whether to start the dialog mode. According to an embodiment of the disclosure, if the first wireless audio device 1100 or the second wireless audio device determines to start the dialog mode, the first wireless audio device 1100 and the second wireless audio device may be configured to operate in the dialog mode. For example, the first wireless audio device 1100 or the second wireless audio device that has determined to start the dialog mode may be configured to transmit a signal instructing to start the dialog mode to another wireless audio device and/or the electronic device 101. According to an embodiment of the disclosure, when both the first wireless audio device 1100 and the second wireless audio device determine to start the dialog mode, the first wireless audio device 1100 and the second wireless audio device may be configured to operate in the dialog mode. For example, the first wireless audio device 1100 or the second wireless audio device that has determined to start the dialog mode may identify whether the other wireless audio device has determined to start the dialog mode and, if both the first wireless audio device 1100 and the second wireless audio device determine to start the dialog mode, the first wireless audio device 1100 and the second wireless audio device may operate in the dialog mode. As another example, the first wireless audio device 1100 or the second wireless audio device that has determined to start the dialog mode may transmit a signal instructing to start the dialog mode to the electronic device 101. If receiving signals instructing to start the dialog mode from both the first wireless audio device 1100 and the second wireless audio device within a designated time, the electronic device 101 may transmit a signal to allow the first wireless audio device 1100 and the second wireless audio device to operate in the dialog mode.

According to various embodiments of the disclosure, an electronic device (e.g., the electronic device 101) may comprise a communication circuit (e.g., the communication module 190), a display (e.g., the display module 160), at least one sensor (e.g., the sensor module 176), and at least one processor (e.g., the processor 120). The at least one processor 120 may be configured to obtain sound data regarding a surrounding environment from a wearable electronic device 700 through the communication circuit 190, obtain sensor data through the at least one sensor 176, identify whether the surrounding environment matches one of a plurality of preset contexts, based on the sound data and the sensor data, and perform at least one of transmitting, to the wearable electronic device 700, a signal for controlling the wearable electronic device 700 through the communication circuit 190 or displaying a notification message on the display 160, based on the matching context, a state of the display 160, and whether the wearable electronic device is outputting a sound, in response to identifying that the surrounding environment matches one of the plurality of preset contexts.

According to various embodiments of the disclosure, the at least one processor 120 may be configured to identify whether the sound data is data related to a sound reproduced by another electronic device and identify whether the surrounding environment matches one of the plurality of preset contexts, based on identifying that the sound data is not the data related to the sound reproduced by another electronic device.

According to various embodiments of the disclosure, the at least one sensor 176 may include a vibration sensor. The at least one processor may be configured to identify that the surrounding environment matches a context in which a user of the electronic device 101 utters, based on the sound data and vibration sensor data obtained through the vibration sensor, and in response to identifying that the surrounding environment matches the context in which the user of the electronic device 101 utters: when the display 160 is on, transmit, to the wearable electronic device 700, a signal for controlling the wearable electronic device 700 to deactivate a noise canceling function, activate an ambient sound hearing function, and stop outputting the sound, when the display 160 is off, and the wearable electronic device 700 is outputting the sound, transmit, to the wearable electronic device 700, a signal for controlling the wearable electronic device 700 to deactivate the noise canceling function, activate the ambient sound hearing function, and stop outputting the sound, and when the display 160 is off, and the wearable electronic device 700 is not outputting the sound, transmit, to the wearable electronic device 700, a signal for controlling the wearable electronic device 700 to deactivate the noise canceling function and activate the ambient sound hearing function.

According to various embodiments of the disclosure, the at least one processor 120 may be configured to identify that the surrounding environment matches a context in which another person is calling a user of the electronic device 101 among the plurality of preset contexts, in response to identifying that the sound data indicates a sound corresponding to preset text, and in response to identifying that the surrounding environment matches the context in which another person is calling the user of the electronic device 101: when the display 160 is on, display the notification message on the display 160, when the display 160 is off, and the wearable electronic device 700 is outputting the sound, transmit, to the wearable electronic device 700, a signal for controlling the wearable electronic device 700 to display the notification message on the display 160 and output a notification sound, and when the display 160 is off, and the wearable electronic device 700 is not outputting the sound, transmit, to the wearable electronic device 700, a signal for controlling the wearable electronic device 700 to output a sound corresponding to the notification message.

According to various embodiments of the disclosure, when it is identified that the surrounding environment matches the context in which another person is calling the user of the electronic device 101, the display 160 is off, and the wearable electronic device 700 is outputting the sound, the notification message displayed on the display 160 may be a heads-up message.

According to various embodiments of the disclosure, when it is identified that the surrounding environment matches the context in which another person is calling the user of the electronic device 101, and the display 160 is on, the notification message displayed on the display 160 may be a toast message.

According to various embodiments of the disclosure, the at least one processor 120 may be configured to identify that the surrounding environment matches a context in which a loud noise occurs, in response to identifying that the sound data indicates a sound greater than or equal to a threshold level and indicates a preset first pattern, and in response to identifying that the surrounding environment matches the context in which the loud noise occurs: when the display 160 is on, and the wearable electronic device 700 is outputting the sound, transmit, to the wearable electronic device 700, a signal for controlling the wearable electronic device 700 to activate a noise canceling function, deactivate an ambient sound hearing function, and increase a volume of the sound being output from the wearable electronic device 700, when the display 700 is on, and the wearable electronic device 700 is not outputting the sound, transmit, to the wearable electronic device 700, a signal for controlling the wearable electronic device 700 to activate the noise canceling function and deactivate the ambient sound hearing function, when the display 160 is off, and the wearable electronic device 700 is outputting the sound, transmit, to the wearable electronic device 700, a signal for controlling the wearable electronic device 700 to activate the noise canceling function, deactivate the ambient sound hearing function, and increase the volume of the sound being output from the wearable electronic device 700, and when the display 160 is off, and the wearable electronic device 700 is not outputting the sound, transmit, to the wearable electronic device 700, a signal for controlling the wearable electronic device 700 to activate the noise canceling function and deactivate the ambient sound hearing function.

According to various embodiments of the disclosure, the at least one sensor 176 may include a GPS sensor. The at least one processor 120 may be configured to, when GPS sensor data obtained through the GPS sensor indicates a predesignated position, and the sound data indicates one of preset sounds, identify that the surrounding environment matches an indoor event context among the plurality of preset contexts, and in response to identifying that the surrounding environment matches the indoor event context: when the display 160 is on, display a notification message corresponding to one of the preset sounds on the display 160, when the display 160 is off, and the wearable electronic device 700 is outputting the sound, transmit, to the wearable electronic device 700, a signal for controlling the wearable electronic device 700 to display, on the display 160, the notification message corresponding to the one of the preset sounds and output a notification sound, and when the display 160 is off, and the wearable electronic device 700 is not outputting the sound, transmit, to the wearable electronic device 700, a signal for controlling the wearable electronic device 700 to output a sound corresponding to the notification message corresponding to the one of the preset sounds.

According to various embodiments of the disclosure, the predesignated position may include at least one of a position specified by an input of a user of the electronic device 101 or a position frequently visited by the user of the electronic device 101.

According to various embodiments of the disclosure, a wearable electronic device (e.g., the wearable electronic device 700) may comprise a communication circuit (e.g., the communication circuit 730), a sound input device (e.g., the sound input device 710), a sound output device (e.g., the sound output device 720), at least one sensor (e.g., the sensor 750), and at least one processor (e.g., the processor 740). The at least one processor 740 may be configured to establish a communication connection with an external electronic device 101 through the communication circuit 730, obtain sound data regarding a surrounding environment through the sound input device 710, obtain sensor data through the at least one sensor 750, identify whether the surrounding environment matches one of a plurality of preset contexts, based on the sound data and the sensor data, and perform at least one of controlling the sound output device 720 or transmitting a signal to the external electronic device 101 to display a notification on a display 160 of the external electronic device 101, based on the matching context, a state of the display 160, and whether the sound output device 720 is outputting a sound, in response to identifying that the surrounding environment matches one of the plurality of preset contexts.

According to various embodiments of the disclosure, the at least one processor 740 may be configured to identify whether the sound data is data related to a sound reproduced by another electronic device and identify whether the surrounding environment matches one of the plurality of preset contexts, based on identifying that the sound data is not the data related to the sound reproduced by another electronic device.

According to various embodiments of the disclosure, the at least one sensor 750 may include a vibration sensor 754. The at least one processor 740 may be configured to identify that the surrounding environment matches a context in which a user of the electronic device utters, based on the sound data and vibration sensor data obtained through the vibration sensor 754, and in response to identifying that the surrounding environment matches the context in which the user of the electronic device utters: when the display 160 of the external electronic device 101 is on, control the sound output device 720 to deactivate a noise canceling function, activate an ambient sound hearing function, and stop outputting the sound, when the display 160 of the external electronic device 101 is off, and the wearable electronic device 700 is outputting the sound, control the sound output device 720 to deactivate the noise canceling function, activate the ambient sound hearing function, and stop outputting the sound, and when the display 160 of the external electronic device 101 is off, and the wearable electronic device 700 is not outputting the sound, control the sound output device 720 to deactivate the noise canceling function and activate the ambient sound hearing function.

According to various embodiments of the disclosure, a method performed in an electronic device (e.g., the electronic device 101) may comprise obtaining sound data regarding a surrounding environment from a wearable electronic device (e.g., the wearable electronic device 700), obtaining sensor data through at least one sensor (e.g., the sensor module 176) of the electronic device 101, identifying whether the surrounding environment matches one of a plurality of preset contexts, based on the sound data and the sensor data, and performing at least one of transmitting a signal for controlling the wearable electronic device 700 to the wearable electronic device 700 or displaying a notification message on a display (e.g., the display module 160) of the electronic device 101, based on the matching context, a state of the display 160, and whether the wearable electronic device 700 is outputting a sound, in response to identifying that the surrounding environment matches one of the plurality of preset contexts.

According to various embodiments of the disclosure, the method may further comprise identifying whether the sound data is data related to a sound reproduced by another electronic device. Identifying whether the surrounding environment matches one of the plurality of preset contexts may be performed based on identifying that the sound data is not the data related to the sound reproduced by another electronic device.

According to various embodiments of the disclosure, obtaining the sensor data through the at least one sensor 176 may include obtaining vibration sensor data through a vibration sensor. Identifying whether the surrounding environment matches one of the plurality of preset contexts includes identifying that the surrounding environment matches a context in which a user of the electronic device 101 utters, based on the vibration sensor data and the sound data. When it is identified that the surrounding environment matches the context in which the user of the electronic device 101 utters, performing at least one of transmitting, to the wearable electronic device 700, the signal for controlling the wearable electronic device 700 or displaying the notification message on the display 160 may include: when the display 160 is on, transmitting, to the wearable electronic device 700, a signal for controlling the wearable electronic device 700 to deactivate a noise canceling function, activate an ambient sound hearing function, and stop outputting the sound, when the display 160 is off, and the wearable electronic device 700 is outputting the sound, transmitting, to the wearable electronic device 700, a signal for controlling the wearable electronic device 700 to deactivate the noise canceling function, activate the ambient sound hearing function, and stop outputting the sound, and when the display 160 is off, and the wearable electronic device 700 is not outputting the sound, transmitting, to the wearable electronic device 700, a signal for controlling the wearable electronic device 700 to deactivate the noise canceling function and activate the ambient sound hearing function.

According to various embodiments of the disclosure, identifying whether the surrounding environment matches one of the plurality of preset contexts may include identifying that the surrounding environment matches a context in which another person is calling a user of the electronic device 101 among the plurality of preset contexts, in response to identifying that the sound data indicates a sound corresponding to preset text. When it is identified that the surrounding environment matches the context in which another person is calling the user of the electronic device 101, performing at least one of transmitting, to the wearable electronic device 700, the signal for controlling the wearable electronic device 700 or displaying the notification message on the display 160 may include: when the display 160 is on, displaying the notification message on the display 160, when the display 160 is off, and the wearable electronic device 700 is outputting the sound, transmitting, to the wearable electronic device 700, a signal for controlling the wearable electronic device 700 to display the notification message on the display 160 and output a notification sound, and when the display 160 is off, and the wearable electronic device 700 is not outputting the sound, transmitting, to the wearable electronic device 700, a signal for controlling the wearable electronic device 700 to output a sound corresponding to the notification message.

According to various embodiments of the disclosure, when it is identified that the surrounding environment matches the context in which another person is calling the user of the electronic device 101, the display 160 is off, and the wearable electronic device 700 is outputting the sound, the notification message displayed on the display 160 may be a heads-up message.

According to various embodiments of the disclosure, when it is identified that the surrounding environment matches the context in which another person is calling the user of the electronic device 101, and the display 160 is on, the notification message displayed on the display 160 may be a toast message.

According to various embodiments of the disclosure, identifying whether the surrounding environment matches one of the plurality of preset contexts may include identifying that the surrounding environment matches a context in which a loud noise occurs, in response to identifying that the sound data indicates a sound greater than or equal to a threshold level and indicates a preset first pattern. When it is identified that the surrounding environment matches the context in which the loud noise occurs, performing at least one of transmitting, to the wearable electronic device 700, the signal for controlling the wearable electronic device 700 or displaying the notification message on the display 160 may include: when the display 160 is on, and the wearable electronic device 700 is outputting the sound, transmitting, to the wearable electronic device 700, a signal for controlling the wearable electronic device 700 to activate a noise canceling function, deactivate an ambient sound hearing function, and increase a volume of the sound being output from the wearable electronic device 700, when the display 700 is on, and the wearable electronic device 700 is not outputting the sound, transmitting, to the wearable electronic device 700, a signal for controlling the wearable electronic device 700 to activate the noise canceling function and deactivate the ambient sound hearing function, when the display 160 is off, and the wearable electronic device 700 is outputting the sound, transmitting, to the wearable electronic device 700, a signal for controlling the wearable electronic device 700 to activate the noise canceling function, deactivate the ambient sound hearing function, and increase the volume of the sound being output from the wearable electronic device 700, and when the display 160 is off, and the wearable electronic device 700 is not outputting the sound, transmitting, to the wearable electronic device 700, a signal for controlling the wearable electronic device 700 to activate the noise canceling function and deactivate the ambient sound hearing function.

According to various embodiments of the disclosure, obtaining the sensor data through the at least one sensor 176 may include obtaining GPS sensor data through a GPS sensor. Identifying whether the surrounding environment matches one of the plurality of preset contexts may include, when the GPS sensor data indicates a predesignated position, and the sound data indicates one of preset sounds, identifying that the surrounding environment matches an indoor event context among the plurality of preset contexts. When it is identified that the surrounding environment matches the indoor event context, performing at least one of transmitting, to the wearable electronic device 700, the signal for controlling the wearable electronic device 700 or displaying the notification message on the display 160 may include: when the display 160 is on, displaying a notification message corresponding to one of the preset sounds on the display 160, when the display 160 is off, and the wearable electronic device 700 is outputting the sound, transmitting, to the wearable electronic device 700, a signal for controlling the wearable electronic device 700 to display, on the display 160, the notification message corresponding to the one of the preset sounds and output a notification sound, and when the display 160 is off, and the wearable electronic device 700 is not outputting the sound, transmitting, to the wearable electronic device 700, a signal for controlling the wearable electronic device 700 to output a sound corresponding to the notification message corresponding to the one of the preset sounds.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:
1. An electronic device comprising:
a communication circuit;
a display;
at least one sensor;
at least one processor; and
memory storing instructions that, when executed by the at least one processor, cause the electronic device to:
 obtain sound data regarding a surrounding environment from a wearable electronic device through the communication circuit,
 obtain sensor data through the at least one sensor,
 identify that the surrounding environment matches a context among a plurality of preset contexts, based on the sound data and the sensor data,
 in response to the matching context being a first preset context in which a dialog between a user of the electronic device and another person is performed, transmit, to the wearable electronic device, a first signal for deactivating a noise canceling function of the wearable electronic device through the communication circuit, and
 in response to the matching context being a second preset context in which the dialog between the user of the electronic device and the other person is not performed:
 when the display is on, and the wearable electronic device is outputting the sound, transmit, to the wearable electronic device through the communication circuit, a second signal for activating the noise canceling function of the wearable electronic device and a signal for controlling the wearable electronic device to deactivate an ambient sound hearing function and increase a volume of the sound being output from the wearable electronic device, and
 when the display is off, and the wearable electronic device is not outputting the sound, transmit, to the wearable electronic device, the second signal and a signal for controlling the wearable electronic device to deactivate the ambient sound hearing function.

2. The electronic device of claim 1, wherein the instructions, when executed by the at least one processor, cause the electronic device to:
in response to identifying that the matching context is a third preset context in which attention of a user of the electronic device is requested among the plurality of preset contexts, and the sound data indicates a sound corresponding to a preset text corresponding to the context in which the attention of the user of the electronic device is requested:
 when the display is on, display a notification message on the display,
 when the display is off, and the wearable electronic device is outputting the sound, transmit, to the wearable electronic device, a signal for controlling the wearable electronic device to display the notification message on the display and output a notification sound, and
 when the display is off, and the wearable electronic device is not outputting the sound, transmit, to the wearable electronic device, a signal for controlling the wearable electronic device to output a sound corresponding to the notification message.

3. The electronic device of claim 2, wherein, in case that the matching context is the third preset context, the display is off, and the wearable electronic device is outputting the sound, the notification message displayed on the display is a heads-up message.

4. The electronic device of claim 2, wherein, in case that the matching context is the third preset context, and the display is on, the notification message displayed on the display is a toast message.

5. The electronic device of claim 1, wherein the instructions, when executed by the at least one processor, cause the electronic device to:
in response to identifying that the matching context is the second preset context in which the dialog between the user of the electronic device and the other person is not performed:
 when the display is on, and the wearable electronic device is not outputting the sound, transmit, to the wearable electronic device, the second signal and a signal for controlling the wearable electronic device to deactivate the ambient sound hearing function, and
 when the display is off, and the wearable electronic device is outputting the sound, transmit, to the wearable electronic device, the second signal and a signal for controlling the wearable electronic device to deactivate the ambient sound hearing function, and increase the volume of the sound being output from the wearable electronic device.

6. The electronic device of claim 1,
wherein the at least one sensor includes a global positioning system (GPS) sensor, and
wherein the instructions, when executed by the at least one processor, cause the electronic device to:
in response to identifying that the matching context is an indoor event preset context in which GPS sensor data obtained through the GPS sensor indicates a predesignated position, and the sound data indicates one of preset sounds:
when the display is on, display a notification message corresponding to one of the preset sounds on the display,
when the display is off, and the wearable electronic device is outputting the sound, transmit, to the wearable electronic device, a signal for controlling the wearable electronic device to display, on the display, the notification message corresponding to the one of the preset sounds and output a notification sound, and
when the display is off, and the wearable electronic device is not outputting the sound, transmit, to the wearable electronic device, a signal for controlling the wearable electronic device to output a sound corresponding to the notification message corresponding to the one of the preset sounds.

7. The electronic device of claim 6, wherein the predesignated position includes at least one of a position specified by an input of the user of the electronic device or a position frequently visited by the user of the electronic device.

8. A non-transitory computer-readable storage medium for storing instructions which, when executed by at least one processor of an electronic device, cause the electronic device to perform:
obtaining sound data regarding a surrounding environment from a wearable electronic device;
obtaining sensor data through at least one sensor of the electronic device;
identifying that the surrounding environment matches a context among a plurality of preset contexts, based on the sound data and the sensor data; and
in response to the matching context being a first context in which a dialog between a user of the electronic device and another person is performed, transmitting, to the wearable electronic device, a first signal for deactivating a noise canceling function of the wearable electronic device, and
in response to the matching context being a second context in which the dialog between the user of the electronic device and the other person is not performed:
when a display of the electronic device is on, and the wearable electronic device is outputting the sound, transmitting, to the wearable electronic device, a second signal for activating the noise canceling function of the wearable electronic device and a signal for controlling the wearable electronic device to deactivate an ambient sound hearing function and increase a volume of the sound being output from the wearable electronic device, and
when the display is off, and the wearable electronic device is not outputting the sound, transmitting, to the wearable electronic device, the second signal and a signal for controlling the wearable electronic device to deactivate the ambient sound hearing function.

9. The non-transitory computer-readable storage medium of claim 8, wherein the instructions which, when executed by the at least one processor of the electronic device, cause the electronic device to perform, in response to identifying that the matching context is a third context in which attention of the user of the electronic device is requested among the plurality of preset contexts, and the sound data indicates a sound corresponding to a preset text corresponding to the context in which the attention of the user of the electronic device is requested:
when the display is on, displaying a notification message on the display,
when the display is off, and the wearable electronic device is outputting the sound, transmitting, to the wearable electronic device, a signal for controlling the wearable electronic device to display the notification message on the display and output a notification sound, and
when the display is off, and the wearable electronic device is not outputting the sound, transmitting, to the wearable electronic device, a signal for controlling the wearable electronic device to output a sound corresponding to the notification message.

10. The non-transitory computer-readable storage medium of claim 8, wherein the instructions, when executed by the at least one processor, cause the electronic device to:
when the matching context is the second context in which the dialog between the user of the electronic device and the other person is not performed:
when the display is on, and the wearable electronic device is not outputting the sound, transmitting, to the wearable electronic device, the second signal and a signal for controlling the wearable electronic device to deactivate the ambient sound hearing function, and
when the display is off, and the wearable electronic device is outputting the sound, transmitting, to the wearable electronic device, the second signal and a signal for controlling the wearable electronic device to deactivate the ambient sound hearing function, and increase the volume of the sound being output from the wearable electronic device.

11. The non-transitory computer-readable storage medium of claim 8,
wherein the obtaining of the sensor data through the at least one sensor includes obtaining global positioning system (GPS) sensor data through a GPS sensor, and
wherein the instructions which, when executed by the at least one processor of the electronic device, cause the electronic device to perform, in response to identifying that the matching context is an indoor event context in which the GPS sensor data indicates a predesignated position, and the sound data indicates one of preset sounds:
when the display is on, displaying a notification message corresponding to one of the preset sounds on the display,
when the display is off, and the wearable electronic device is outputting the sound, transmitting, to the wearable electronic device, a signal for controlling the wearable electronic device to display, on the display, the notification message corresponding to the one of the preset sounds and output a notification sound, and
when the display is off, and the wearable electronic device is not outputting the sound, transmitting, to the wearable electronic device, a signal for controlling the wearable electronic device to output a sound corresponding to the notification message corresponding to the one of the preset sounds.

* * * * *